United States Patent
Masuda et al.

(10) Patent No.: US 12,009,382 B2
(45) Date of Patent: Jun. 11, 2024

(54) IMAGING DEVICE AND ELECTRONIC DEVICE

(71) Applicant: SONY SEMICONDUCTOR SOLUTIONS CORPORATION, Kanagawa (JP)

(72) Inventors: Yoshiaki Masuda, Kanagawa (JP); Tomohiko Asatsuma, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 523 days.

(21) Appl. No.: 17/420,471

(22) PCT Filed: Dec. 19, 2019

(86) PCT No.: PCT/JP2019/049885
§ 371 (c)(1),
(2) Date: Jul. 2, 2021

(87) PCT Pub. No.: WO2020/149096
PCT Pub. Date: Jul. 23, 2020

(65) Prior Publication Data
US 2022/0085092 A1 Mar. 17, 2022

(30) Foreign Application Priority Data
Jan. 18, 2019 (JP) .................................. 2019-007249

(51) Int. Cl.
*H01L 27/146* (2006.01)
*H01L 31/153* (2006.01)

(52) U.S. Cl.
CPC .... *H01L 27/14634* (2013.01); *H01L 27/1462* (2013.01); *H01L 27/14623* (2013.01);
(Continued)

(58) Field of Classification Search
CPC .......... H01L 27/14634; H01L 27/1462; H01L 27/14623; H01L 27/14636; H01L 27/1469; H01L 31/153
See application file for complete search history.

(56) References Cited

U.S. PATENT DOCUMENTS

| 2017/0221956 A1* | 8/2017 | Tsukimura ........ H01L 27/14634 |
| 2017/0294467 A1 | 10/2017 | Tamiya |
| 2018/0219041 A1* | 8/2018 | Takemoto ......... H01L 27/14627 |

FOREIGN PATENT DOCUMENTS

| JP | 2014-130890 | 7/2014 |
| JP | 2014-135535 | 7/2014 |

(Continued)

OTHER PUBLICATIONS

International Search Report prepared by the Japan Patent Office dated Feb. 27, 2020, for International Application No. PCT/JP2019/049885.

*Primary Examiner* — Peniel M Gumedzoe
(74) *Attorney, Agent, or Firm* — SHERIDAN ROSS P.C.

(57) ABSTRACT

There is provided an imaging device capable of further improving image quality of a subject, particularly a lesion portion such as cancer. There is provided an imaging device including: a first substrate including a first pixel array unit in which a plurality of pixels having at least a first photoelectric conversion unit is arranged in a two-dimensional manner, a first wiring layer, and a first support layer stacked in this order; and a second substrate including a second pixel array unit in which a plurality of pixels having at least a second photoelectric conversion unit is arranged in a two-dimensional manner, a second wiring layer, and a second support layer stacked in this order, in which the first support layer and the second support layer are bonded to each other to form a stacked structure, and at least one of the support layers includes an antireflection layer.

16 Claims, 11 Drawing Sheets

(52) U.S. Cl.
CPC .... *H01L 27/14636* (2013.01); *H01L 27/1469* (2013.01); *H01L 31/153* (2013.01)

(56) References Cited

FOREIGN PATENT DOCUMENTS

| | | |
|---|---|---|
| JP | 2015-092592 | 5/2015 |
| JP | 2015-192015 | 11/2015 |
| WO | WO 2016/111010 | 7/2016 |

* cited by examiner

IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2019/049885 having an international filing date of 19 Dec. 2019, which designated the United States, which PCT application claimed the benefit of Japanese Patent Application No. 2019-007249 filed 18 Jan. 2019, the entire disclosures of each of which are incorporated herein by reference.

TECHNICAL FIELD

The present technology relates to an imaging device and an electronic device.

BACKGROUND ART

In recent years, as the demand for imaging devices (image sensors) has been increasing, endoscopic systems equipped with imaging devices (image sensors) have been widely used to detect cancer in living tissue or the like.

For example, Patent Document 1 proposes a technology capable of simultaneously acquiring a visible light image and an infrared light image with an inexpensive configuration.

CITATION LIST

Patent Document

Patent Document 1: Japanese Patent Application Laid-Open No. 2014-135535

SUMMARY OF THE INVENTION

Problems to be Solved by the Invention

However, the technology proposed in Patent Document 1 may not be capable of further improving image quality of a subject, particularly a lesion portion such as cancer.

Accordingly, the present technology has been made in view of such a situation, and has a main object to provide an imaging device that can achieve further improvement of the image quality of a subject, particularly a lesion portion such as cancer, and an electronic device equipped with the imaging device.

Solutions to Problems

As a result of diligent research to achieve the above-described object, the present inventors have succeeded in achieving further improvement of the image quality of an imaging device, and have completed the present technology.

That is, in the present technology, there is provided an imaging device including:

a first substrate including a first pixel array unit in which a plurality of pixels having at least a first photoelectric conversion unit that performs photoelectric conversion is arranged in a two-dimensional manner, a first wiring layer, and a first support layer stacked in this order, and
a second substrate including a second pixel array unit in which a plurality of pixels having at least a second photoelectric conversion unit that performs photoelectric conversion is arranged in a two-dimensional manner, a second wiring layer, and a second support layer stacked in this order, in which the first support layer and the second support layer are bonded to each other to form a stacked structure of the first substrate and the second substrate, and at least one of the first support layer or the second support layer includes an antireflection layer.

As a first aspect of the imaging device according to the present technology, the antireflection layer may include a light-shielding film that shields excitation light with which a subject is irradiated and/or a transmission film that transmits fluorescence emitted from the subject by the excitation light, and in this case, the excitation light may have a wavelength of 760 nm±10 nm, and the fluorescence may have a wavelength of 850 nm±10 nm.

As a second aspect of the imaging device according to the present technology, the first support layer may include a first antireflection layer, and the second support layer may include a second antireflection layer, the first antireflection layer may include a light-shielding film that shields excitation light with which a subject is irradiated and/or a transmission film that transmits fluorescence emitted from the subject by the excitation light, and the second antireflection layer may include a light-shielding film that shields excitation light with which a subject is irradiated and/or a transmission film that transmits fluorescence emitted from the subject by the excitation light, and in this case, the excitation light may have a wavelength of 760 nm±10 nm, and the fluorescence may have a wavelength of 850 nm±10 nm.

As a third aspect of the imaging device according to the present technology, the first support layer may include a first adhesive layer, a first antireflection layer, and a second adhesive layer stacked in this order, the second support layer may include a third adhesive layer, a second antireflection layer, and a fourth adhesive layer stacked in this order, the second adhesive layer and the third adhesive layer may be bonded to each other to form a stacked structure of the first substrate and the second substrate, the first antireflection layer may include a light-shielding film that shields excitation light with which a subject is irradiated and/or a transmission film that transmits fluorescence emitted from the subject by the excitation light, and the second antireflection layer may include a light-shielding film that shields excitation light with which a subject is irradiated and/or a transmission film that transmits fluorescence emitted from the subject by the excitation light, and in this case, the excitation light may have a wavelength of 760 nm±10 nm, and the fluorescence may have a wavelength of 850 nm±10 nm.

In the third aspect of the imaging device according to the present technology, the first adhesive layer may include a silicon oxide film, the first antireflection layer may include a silicon nitride film, and the second adhesive layer may include a silicon oxide film, and the third adhesive layer may include a silicon nitride film, the second antireflection layer may include a silicon oxide film, and the fourth adhesive layer may include a silicon nitride film.

In the third aspect of the imaging device according to the present technology, the first adhesive layer may include a silicon nitride film, the first antireflection layer may include a silicon oxide film, and the second adhesive layer may include a silicon nitride film, and the third adhesive layer may include a silicon oxide film, the second antireflection layer may include a silicon nitride film, and the fourth adhesive layer may include a silicon oxide film.

As a fourth aspect of the imaging device according to the present technology, a light emitting element that outputs excitation light with which a subject is irradiated may be further included.

As a fifth aspect of the imaging device according to the present technology, the second wiring layer may have a wiring, and the wiring may be a transparent wiring.

As a sixth aspect of the imaging device according to the present technology, the second wiring layer may have a wiring, and the wiring may be arranged in at least one area corresponding to between the pixels adjacent to each other in the plurality of pixels arranged two-dimensionally in the second pixel array unit.

As a seventh aspect of the imaging device according to the present technology, the second wiring layer may have a wiring, and the wiring may be arranged only in an area corresponding to the pixels of at least a part of the plurality of pixels arranged two-dimensionally in the second pixel array unit.

Moreover, the present technology provides an electronic device equipped with an imaging device according to the present technology.

According to the present technology, further improvement in image quality can be achieved. Note that the effects described here are not necessarily limited, and may be any effect described in the present disclosure.

MODE FOR CARRYING OUT THE INVENTION

Figure 1:
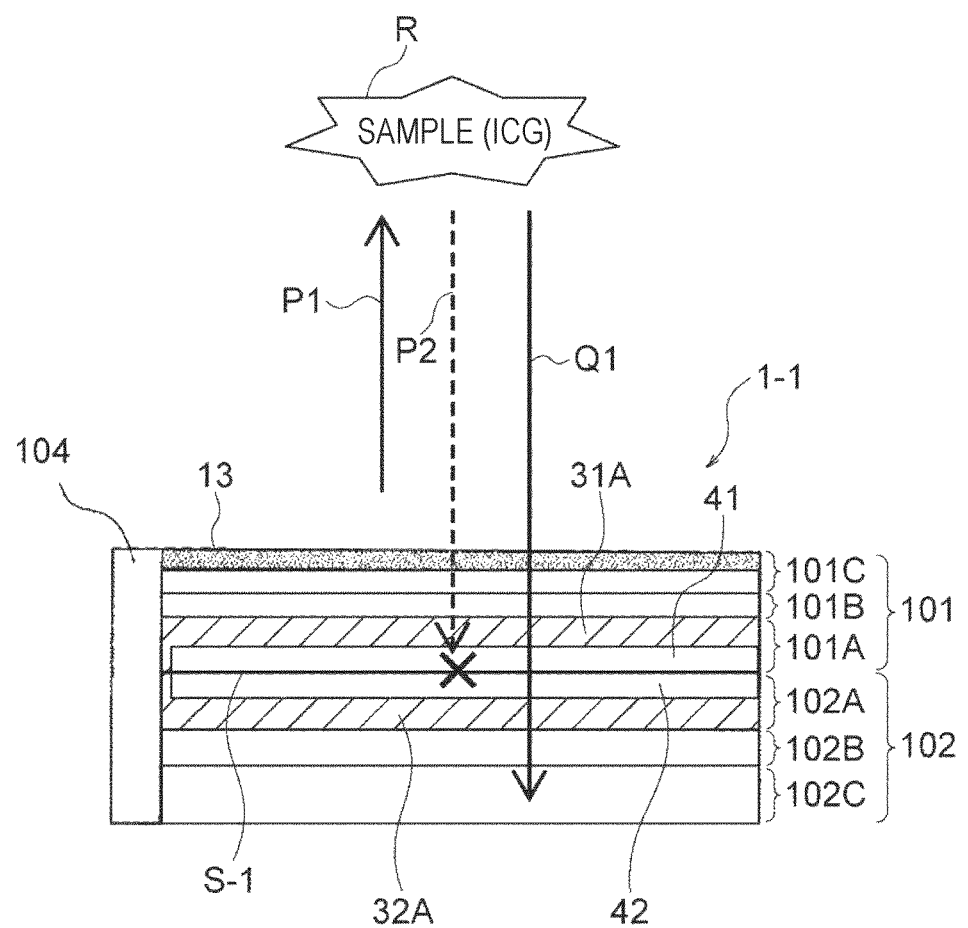
FIG. 1 is a cross-sectional view illustrating a configuration example of an imaging device to which the present technology is applied.

Hereinafter, preferred embodiments for carrying out the present technology will be described. Note that the embodiments described below are examples of representative embodiments of the present technology, and the scope of the present technology is not interpreted in a narrow sense by them. Note that unless otherwise specified, in the drawings, "upper" means an upper direction or an upper side in the drawings, "lower" means a lower direction or a lower side in the drawings, "left" means a left direction or a left side in the drawings, and "right" means a right direction or a right side in the drawings. Furthermore, in the drawings, the same or equivalent elements or members are designated by the same reference numerals, and duplicate descriptions will be omitted.

The description will be made in the following order.
1. Overview of present technology
2. First embodiment (example 1 of imaging device)
3. Second embodiment (example 2 of imaging device)
4. Third embodiment (example of electronic device)
5. Application example of imaging device to which present technology is applied
   5-1. Configuration example of camera system
   5-2. Example of application to internal information acquisition system including capsule-type endoscope
   5-3. Example of using imaging device
   5-4. Example of application to endoscopic surgery system 1. Overview of Present Technology First, the overview of the present technology will be described.

In the case of an endoscopic system, in addition to normal observation using visible light, special observation using infrared light or the like is performed. A fluorescent substance called indocyanine green (ICG), which has an affinity for lesions such as cancer and is excited to fluoresce in the infrared region, is administered into the body of a test subject in advance and irradiated with excitation light that excites the fluorescent substance, and thereby the fluorescence from the fluorescent substance accumulated in the lesion portion can be detected. Since strong fluorescence is emitted from the lesion portion, presence or absence of a lesion can be determined from brightness of the fluorescence image.

Examples of medical fluorescent substances (fluorescent materials) include Katushka2S (excitation wavelength 588 nm, fluorescence wavelength 633 nm), above-described ICG (excitation wavelength 750 to 810 nm, fluorescence wavelength 835 nm), and 5-ALA (excitation wavelength 375 to 445 nm, Fluorescence wavelength 600 to 740 nm).

Figure 10:
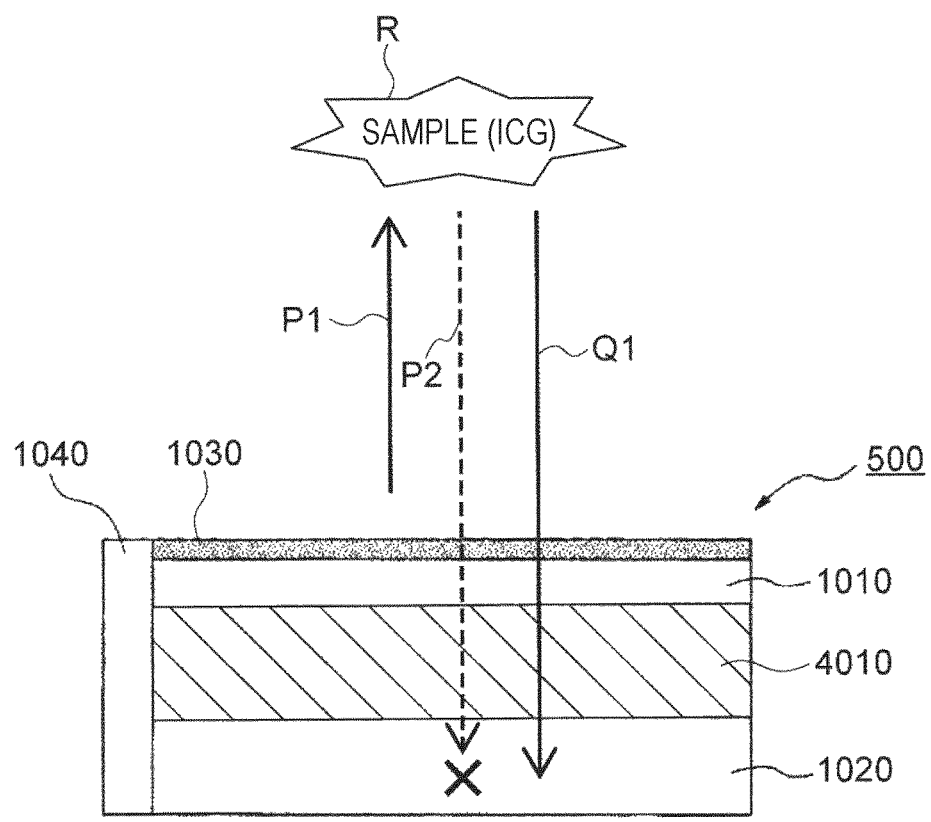
FIG. 10 is a cross-sectional view illustrating a general configuration example of the imaging device.

FIG. 10 illustrates an imaging device 500. It is a cross-sectional view illustrating a cross section of an imaging device having a support layer 4010 sandwiched between a first substrate 1010 and a second substrate 1020. The imaging device 400 includes a first substrate 1010, a second substrate 1020, a color filter 1030, a connection portion 1040, and a support layer 4010.

The imaging device 500 detects not only a desired fluorescence Q1 (for example, wavelength 850 nm) but also a reflected light P2 (for example, wavelength 760 nm) of an excitation light P1 (for example, wavelength 760 nm) from a subject (for example, ICG sample) R, and has an SN ratio that is not preferable in some cases. In a case where a light-shielding film is set on an upper layer (for example, the color filter 1030) of the imaging device 500, light other than the excitation light P1 is also shielded, and thus an optical design may be difficult.

The present technology has been made in view of the above. The present technology is an imaging device including a first substrate including a first pixel array unit in which a plurality of pixels having at least a first photoelectric conversion unit that performs photoelectric conversion is arranged in a two-dimensional manner, a first wiring layer, and a first support layer stacked in this order, and a second substrate including a second pixel array unit in which a plurality of pixels having at least a second photoelectric conversion unit that performs photoelectric conversion is arranged in a two-dimensional manner, a second wiring layer, and a second support layer stacked in this order, in which the first support layer and the second support layer are bonded to each other to form a stacked structure of the first substrate and the second substrate, and at least one of the first support layer or the second support layer includes an antireflection layer. The antireflection layer may be formed by one film or a plurality of films. Then, the antireflection layer can include a light-shielding film that shields excitation light and/or a transmission film that transmits fluorescence emitted from the subject by the excitation light.

According to the present technology, further improvement in image quality of a subject, particularly a lesion portion such as cancer, can be achieved. Specifically, according to the present technology, the excitation light can be selectively shielded, the fluorescence can be selectively transmitted, or the excitation light can be selectively shielded and the fluorescence can be selectively transmitted.

Hereinafter, imaging devices of embodiments (first embodiment and second embodiment) according to the present technology will be described concretely and in detail.

2. First Embodiment (Example 1 of Imaging Device)

An imaging device of a first embodiment (Example 1 of the imaging device) according to the present technology includes a first substrate including a first pixel array unit in which a plurality of pixels having at least a first photoelectric conversion unit that performs photoelectric conversion is arranged in a two-dimensional manner, a first wiring layer, and a first support layer stacked in this order, and a second substrate including a second pixel array unit in which a plurality of pixels having at least a second photoelectric conversion unit that performs photoelectric conversion is arranged in a two-dimensional manner, a second wiring layer, and a second support layer stacked in this order, in which the first support layer and the second support layer are bonded to each other to form a stacked structure of the first substrate and the second substrate, and at least one of the first support layer or the second support layer includes an antireflection layer.

With the imaging device of the first embodiment (Example 1 of the imaging device) according to the present technology, further improvement in image quality of a subject, particularly a lesion portion such as cancer, can be achieved. Specifically, with the imaging device of the first embodiment (Example 1 of the imaging device) according to the present technology, an optical design capable of shielding excitation light and transmitting fluorescence can be achieved.

Hereinafter, the imaging device of the first embodiment according to the present technology will be described using FIGS. 1 to 7.

First, the description will be given using FIG. 1. FIG. 1 is a cross-sectional view illustrating an imaging device 1-1 of the first embodiment according to the present technology.

The imaging device 1-1 illustrated in FIG. 1 includes a first substrate 101 and a second substrate 102, in which the first substrate 101 and the second substrate 102 are bonded to each other via a connection portion 104 arranged on left side surfaces of the first substrate 101 and the second substrate 102, so as to have a stacked structure of the first substrate 101 and the second substrate 102. More specifically, the imaging device 1-1 includes a first substrate including a first pixel array unit 101C having a color filter 13, a first wiring layer 101B, and a first support layer 101A stacked in this order, and a second substrate 102 including a second pixel array unit 102C, a second wiring layer 102B, and a second support layer 102A stacked in this order, in which the first support layer 101A and the second support layer 101B are bonded to each other to form a stacked structure of the first substrate 101 and the second substrate 102.

Furthermore, it may be considered that in the imaging device 1-1, with the first pixel array unit 101C and the first wiring layer 101B of the first substrate 101 and the second pixel array unit 102C and the second wiring layer 102B of the second substrate 102, the first wiring layer 101B and the second wiring layer 102B are bonded to each other with the first support layer 101A of the first substrate 101 and the second support layer 102A of the second substrate 102 interposed therebetween, forming a stacked structure of the first pixel array unit 101C and the first wiring layer 101B, and the second pixel array unit 102C and the second wiring layer 102B.

The first support layer 101A includes a first adhesive layer 31A and a first antireflection layer 41 stacked, the second support layer 102A includes a fourth adhesive layer 32A and a second antireflection layer 42 stacked, and a first antireflection layer 41 and a second antireflection layer 42 are bonded to each other via a joint surface S-1. The joint surface S-1 is formed by a lower surface (lower side of FIG. 1) of the first antireflection layer 41 and an upper surface (upper side of FIG. 1) of the second antireflection layer 42.

Although not illustrated in FIG. 1, the first support layer 101A may be provided with a second adhesive layer on a surface of the first antireflection layer 41 on which the first adhesive layer 31A is not stacked (in FIG. 1, the lower surface of the first antireflection layer 41), the first support layer 102A may be provided with a third adhesive layer on a surface of the second antireflection layer 42 on which the fourth adhesive layer 32A is not stacked (in FIG. 1, the upper surface of the second antireflection layer 42), and in this case, the joint surface S-1 is formed by a lower surface (lower side of FIG. 1) of the second adhesive layer and an upper surface (upper side of FIG. 1) of the third adhesive layer.

In the imaging device 1-1 in FIG. 1, the first adhesive layer 31A and the fourth adhesive layer 32A are directly bonded to each other while being in contact with the connection portion 104, and a part of the left side of the joint surface S-1 (left side in FIG. 1) is formed by a lower surface of the first adhesive layer 31A and an upper surface of the fourth adhesive layer 32A. Note that without having a part where the first adhesive layer 31A and the fourth adhesive layer 32A are directly bonded to each other, the entire joint surface S-1 (entire surface) may be formed by the lower surface (lower side of FIG. 1) of the first antireflection layer 41 and the upper surface (upper side of FIG. 1) of the second antireflection layer 42 or, as described above, although not illustrated in FIG. 1, may be formed by the lower surface (lower side of FIG. 1) of the second adhesive layer and the upper surface (upper side of FIG. 1) of the third adhesive layer.

In the imaging device 1-1, fluorescence Q1 (for example, a wavelength of 850 nm) is selectively transmitted through the first support layer 101A and the second support layer 102A and is detected by the second pixel array unit 102C (second substrate 102). The reflected light P2 (for example, wavelength 760 nm) of the excitation light P1 (for example, wavelength 760 nm) from the subject (for example, ICG sample) R is shielded in the first support layer 101A and/or in the second support layer 102A.

Figure 2:
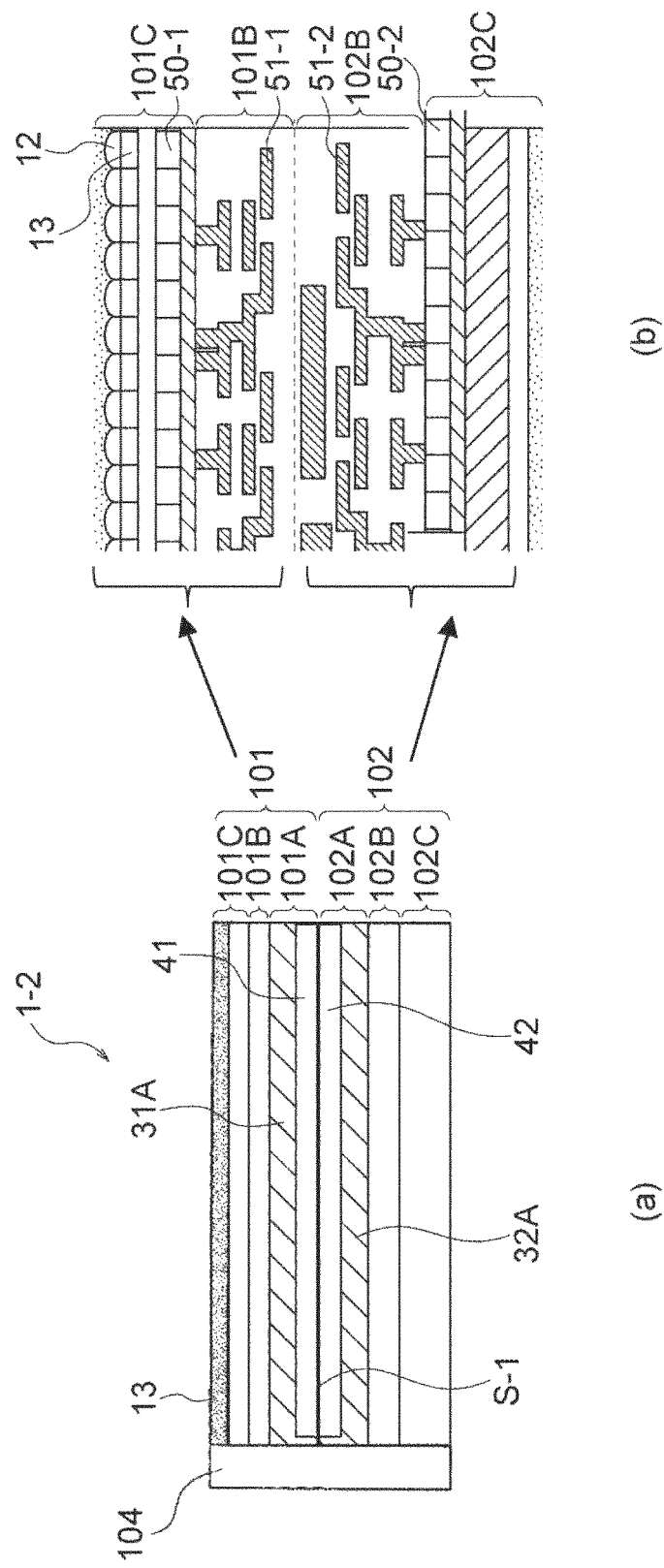
FIG. 2 is a cross-sectional view illustrating a configuration example of the imaging device to which the present technology is applied.

Next, the description will be given using FIG. 2. FIG. 2(*a*) is a cross-sectional view illustrating an imaging device 1-2 of the first embodiment according to the present technology, and FIG. 2(*b*) is an enlarged cross-sectional view of the first substrate 101 provided in the imaging device 1-2 excluding the first support layer 101A, that is, the first pixel array unit 101C and the first wiring layer 101B and an enlarged cross-sectional view of the first substrate 102 provided in the imaging device 1-2 excluding the second support layer 102A, that is, the second pixel array unit 102C and the second wiring layer 102B.

As illustrated in FIG. 2(*a*), the imaging device 1-2 of the first embodiment according to the present technology includes the first substrate 101 and the second substrate 102, and the first substrate 101 and the second substrate 102 are bonded to each other via the connection portion 104 arranged on the left side surfaces of the first substrate 101 and the second substrate 102 to have a stacked structure of the first substrate 101 and the second substrate 102. That is, the imaging device 1-2 includes a first substrate including a first pixel array unit 101C having a color filter 13, a first wiring layer 101B, and a first support layer 101A stacked in this order, and a second substrate 102 including a second pixel array unit 102C, a second wiring layer 102B, and a second support layer 102A stacked in this order, in which the first support layer 101A and the second support layer 101B are bonded to each other to form a stacked structure of the first substrate 101 and the second substrate 102.

Furthermore, it may be considered that in the imaging device 1-2, with the first pixel array unit 101C and the first wiring layer 101B of the first substrate 101 and the second pixel array unit 102C and the second wiring layer 102B of the second substrate 102, the first wiring layer 101B and the second wiring layer 102B are bonded to each other with the first support layer 101A of the first substrate 101 and the second support layer 102A of the second substrate 102 interposed therebetween, forming a stacked structure of the first pixel array unit 101C and the first wiring layer 101B, and the second pixel array unit 102C and the second wiring layer 102B.

The first support layer 101A includes a first adhesive layer 31A and a first antireflection layer 41 stacked, the second support layer 102A includes a fourth adhesive layer 32A and a second antireflection layer 42 stacked, and a first antireflection layer 41 and a second antireflection layer 42 are bonded to each other via a joint surface S-1. The joint surface S-1 is formed by a lower surface (lower side of FIG. 2(*a*)) of the first antireflection layer 41 and an upper surface (upper side of FIG. 2(*a*)) of the second antireflection layer 42.

Although not illustrated in FIG. 2(*a*), the first support layer 101A may be provided with a second adhesive layer on a surface of the first antireflection layer 41 on which the first adhesive layer 31A is not stacked (in FIG. 2(*a*), the lower surface of the first antireflection layer 41), the first support layer 102A may be provided with a third adhesive layer on a surface of the second antireflection layer 42 on which the fourth adhesive layer 32A is not stacked (in FIG. 2(*a*), the upper surface of the second antireflection layer 42), and in this case, the joint surface S-1 is formed by a lower surface (lower side of FIG. 2(*a*)) of the second adhesive layer and an upper surface (upper side of FIG. 2(*a*)) of the third adhesive layer.

In the imaging device 1-2 in FIG. 2(*a*), the first adhesive layer 31A and the fourth adhesive layer 32A are directly bonded to each other while being in contact with the connection portion 104, and a part of the left side of the joint surface S-1 (left side in FIG. 1) is formed by a lower surface of the first adhesive layer 31A and an upper surface of the fourth adhesive layer 32A. Note that without having a part where the first adhesive layer 31A and the fourth adhesive layer 32A are directly bonded to each other, the entire joint surface S-1 (entire surface) may be formed by the lower surface (lower side of FIG. 2(*a*)) of the first antireflection layer 41 and the upper surface (upper side of FIG. 1) of the second antireflection layer 42 or, as described above, although not illustrated in FIG. 2(*a*), may be formed by the lower surface (lower side of FIG. 2(*a*)) of the second adhesive layer and the upper surface (upper side of FIG. 2(*a*)) of the third adhesive layer.

FIG. 2(*b*) illustrates a stacked structure of the first pixel array unit 101C and the first wiring layer 101B and a stacked structure of the second pixel array unit 102C and the second wiring layer 102B, as an enlarged cross-sectional view.

In the first pixel array unit 101C, an on-chip lens 12, a color filter 13, and a first photoelectric conversion unit (for example, photodiode (PD)) 50-1 that performs photoelectric conversion of visible light are formed in order from an incident side of light (upper side in FIG. 2(*b*)), and a first wiring 51-1 and the like are formed in the first wiring layer 101B below the first pixel array unit 101C (lower side in FIG. 2(*b*)). Then, a second photoelectric conversion unit (for example, photodiode (PD)) 50-2 that performs photoelectric conversion of fluorescence is formed on an upper portion (upper side in FIG. 2(*b*)) of the second pixel array unit 102C, and a second wiring 51-2 and the like are formed in the second wiring layer 102B above the second pixel array unit 102C.

As described above, the imaging device 1-2 includes the first pixel array unit 101C that detects visible light and the second pixel array unit 102C that detects fluorescence, and since the first wiring layer 101B and the second wiring layer 102B are arranged in order from the incident side of light (upper side in FIG. 2) between the first pixel array unit 101C and the second pixel array unit 102C, when the first wiring 51-1 formed in the first wiring layer 101B and/or the second wiring 51-2 formed in the second wiring layer 102B is a metal wiring such as tungsten (W) or aluminum (Al), fluorescence may be shielded before the fluorescence reaches the second pixel array unit 102C.

As long as the second pixel array unit 102C can detect fluorescence, the first wiring 51-1 may be a metal wiring such as tungsten (W) or aluminum (Al), and the second wiring 51-2 may be a metal wiring such as tungsten (W) or aluminum (Al). However, in a case where efficient detection of fluorescence is performed, the first wiring 51-1 is preferably a transparent wiring (for example, a wiring including ITO), and the second wiring 51-2 is preferably a transparent wiring (for example, a wiring including ITO). Then, in a case where further efficient detection of fluorescence is performed, it is preferable that both the first wiring 51-1 and the second wiring 51-2 are transparent wirings (for example, wirings including ITO).

Figure 3:
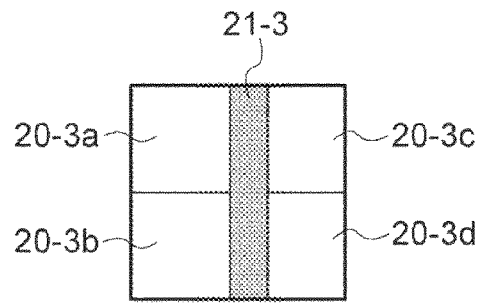
FIG. 3 is a view for explaining a relationship between a wiring and pixels (photodiodes (PD)).
Figure 4:
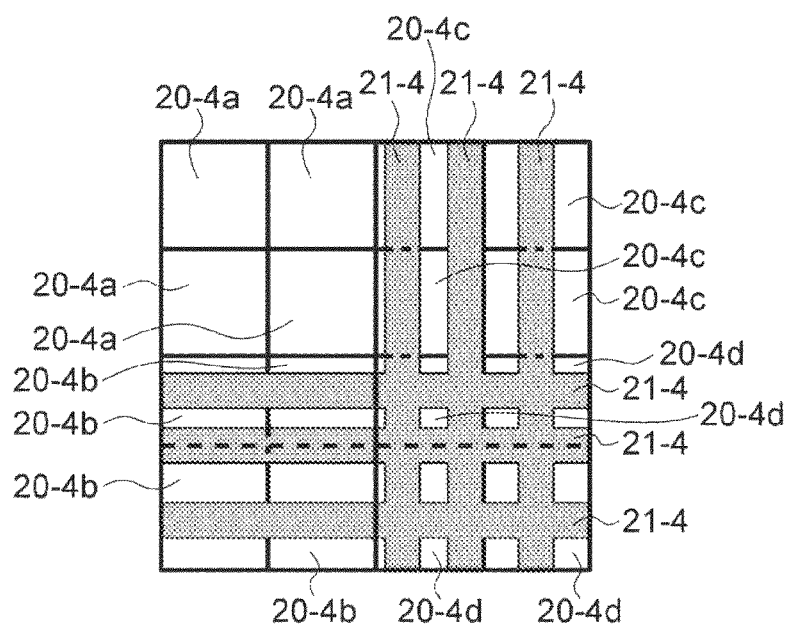
FIG. 4 is a view for explaining a relationship between a wiring and pixels (photodiodes (PD)).
Figure 5:
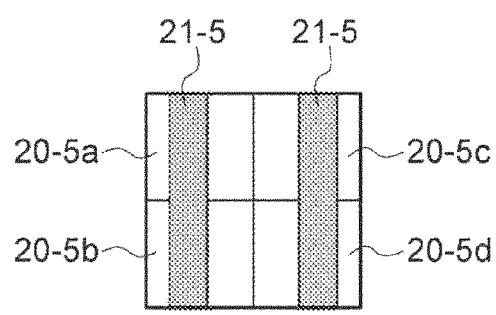
FIG. 5 is a view for explaining a relationship between a wiring and pixels (photodiodes (PD)).

Avoidance of shielding fluorescence will be further described using FIGS. 3 to 5.

FIGS. 3 to 5 are top views for explaining the relationship between wiring and pixels (photodiodes (PD)) in the imaging device of the first embodiment according to the present technology.

First, the description will be given using FIG. 3. In FIG. 3, pixels 20-3a to 20-3d for four pixels are illustrated, a wiring 21-3 is arranged between the pixels 20-3a and the pixels 20-3c adjacent to each other and between the pixels 20-3b and the pixels 20-3d adjacent to each other. That is, by arranging the wiring at the boundary between one photoelectric conversion unit (for example, a photodiode) and the other photoelectric conversion unit (for example, a photodiode) adjacent to each other without arranging the wiring 21-3 at a substantially center portion of the photoelectric conversion unit (for example, a photodiode) that the pixels 20-3a to 20-3d for four pixels have for every pixel, the second pixel array unit 102C can detect fluorescence efficiently even if the wiring 21-3 is a metal wiring. Note that if the wiring 21-3 is a transparent wiring, the second pixel array unit 102C can detect fluorescence more efficiently. The wiring 21-3 may be used as the first wiring 51-1, may be used as the second wiring 51-2, or may be used for both the first wiring 51-1 and the second wiring 51-2.

Next, the description will be given using FIG. 4. In FIG. 4, pixels 20-4a for 4 pixels, pixels 20-4b for 4 pixels, pixels 20-4c for 4 pixels, and pixels 20-4d for 4 pixels are illustrated (16 pixels in total), and a wiring 21-4 is arranged so as to correspond to the pixels 20-4b, the pixels 20-4c, and the pixels 20-d for 12 pixels, and the wiring 21-4 is not arranged to locations corresponding to the pixels 20-4a for 4 pixels. That is, with the configuration of this wiring arrangement, by separating into the pixels that detect fluorescence (pixels 20-4a in FIG. 4) and the pixels that do not detect fluorescence (pixels 20-4b, pixels 20-4c, and pixels 20-4d in FIG. 4)), the second pixel array unit 102C can efficiently detect fluorescence even if the wiring 21-4 is a metal wiring. Note that if the wiring 21-4 is a transparent wiring, the second pixel array unit 102C can detect fluorescence more efficiently. The configuration of the wiring arrangement illustrated in FIG. 4 may be applied to the first wiring layer 101B, the second wiring layer 102B, or both the first wiring layer 101B and the second wiring layer 102B.

This will be described using FIG. 5. In FIG. 5, pixels 20-5a to 20-5d for four pixels are illustrated, and a wiring 21-5 is arranged corresponding to each pixel of pixels 20-5a to 20-5d. In a case where fluorescence is not shielded by the wiring 21-5, the photoelectric conversion unit (photodiode (PD)) of each pixel of the pixels 20-5a to 20-5d can detect the fluorescence and thus a metal wiring may be used for the wiring 21-5, but in a case where fluorescence is shielded by the wiring 21-5 or is not shielded more efficiently, it is preferable to use transparent wiring for the wiring 21-5. As long as fluorescence can be detected, the wiring 21-5 may be used as the first wiring 51-1, may be used as the second wiring 51-2, or may be used for both the first wiring 51-1 and the second wiring 51-2.

Figure 6:
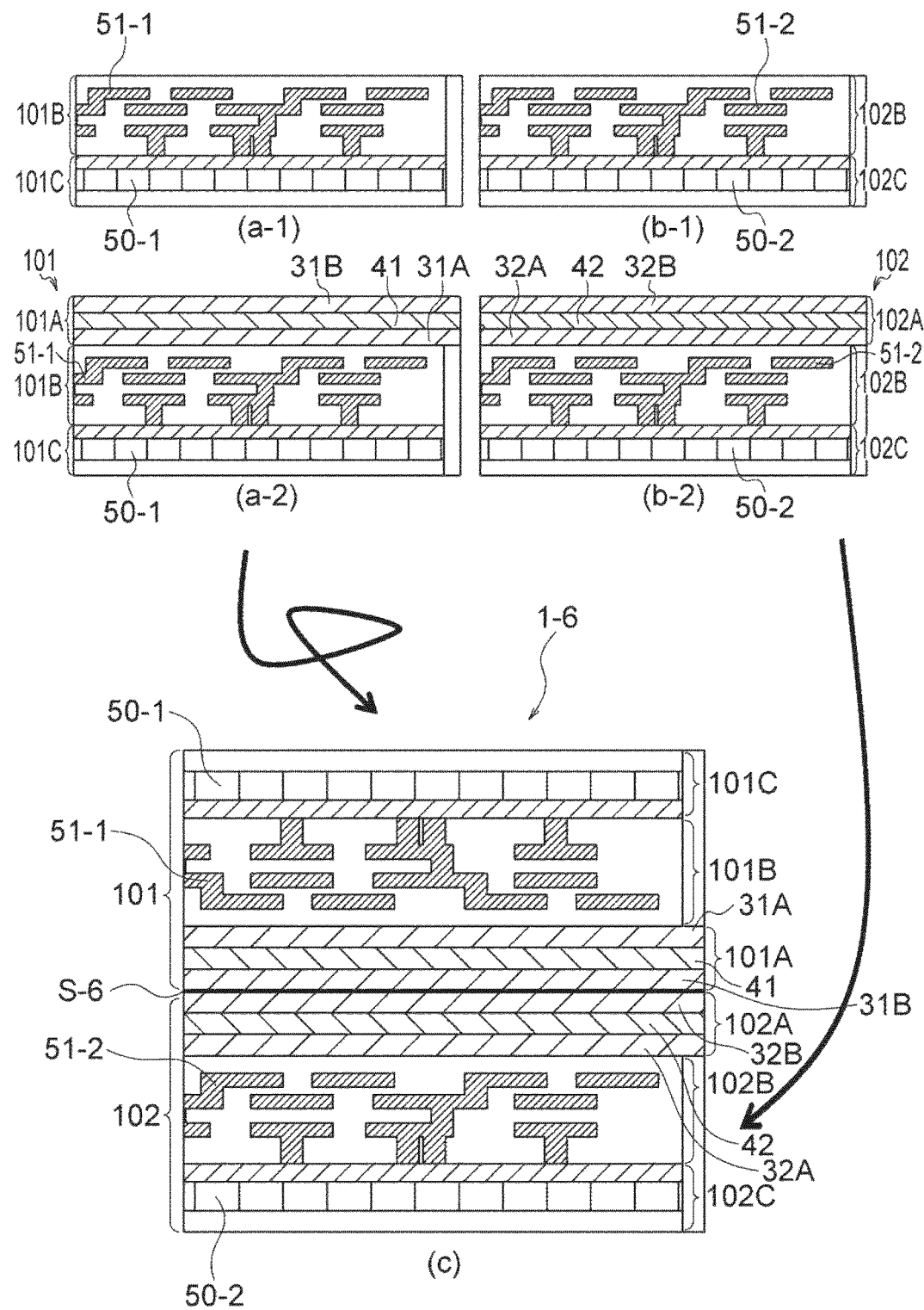
FIG. 6 is a cross-sectional view for explaining a manufacturing method of the imaging device to which the present technology is applied.

FIG. 6 is a cross-sectional view for explaining a manufacturing method of an imaging device 1-6 of the first embodiment according to the present technology.

FIGS. 6(a-1) and 6(a-2) illustrate a manufacturing method of the first substrate 101. As illustrated in FIG. 6(a-1), the first wiring layer 101B is stacked on the first pixel array unit 101C.

In FIG. 6(a-2), the first support layer 101A is stacked on the first wiring layer 101B. That is, the first adhesive layer 31A is stacked on the first wiring layer 101B, the first antireflection layer 41 is stacked on the first adhesive layer 31A, and a second adhesive layer 31B is stacked on the first antireflection layer 41, thereby manufacturing the first substrate 101.

FIGS. 6(b-1) and 6(b-2) illustrate a manufacturing method of the second substrate 102. As illustrated in FIG. 6(b-1), the second wiring layer 102B is stacked on the second pixel array unit 102C.

In FIG. 6(b-2), the second support layer 102A is stacked on the second wiring layer 102B. That is, the fourth adhesive layer 32A is stacked on the second wiring layer 101B, the second antireflection layer 42 is stacked on the fourth adhesive layer 32A, and a third adhesive layer 32B is stacked on the first antireflection layer 42, thereby manufacturing the second substrate 102.

As illustrated in FIG. 6(c), the first substrate 101 being rotated 180 degrees and the second adhesive layer 31B and the third adhesive layer 32B are bonded to each other so that a lower surface (lower side in FIG. 8(c)) of the second adhesive layer 31B of the first substrate 101 and an upper surface (upper side in FIG. 8(c)) of the third adhesive layer 32B of the second substrate 102 are bonded to each other so as to form a joint surface S-6, thereby manufacturing the imaging device 1-6.

The imaging device 1-6 includes a first substrate including a first pixel array unit 101C having a photoelectric conversion unit (PD) 50-1, a first wiring layer 101B, and a first support layer 101A stacked in this order, and a second substrate 102 including a second pixel array unit 102C having a photoelectric conversion unit (PD) 50-2, a second wiring layer 102B, and a second support layer 102A stacked in this order, in which the first support layer 101A and the second support layer 101B are bonded to each other to form a stacked structure of the first substrate 101 and the second substrate 102.

Each of the first adhesive layer 31A, the first antireflection layer 41, and the second adhesive layer 31B may be formed by one film or may be formed by a plurality of films. Each of the fourth adhesive layer 32A, the second antireflection layer 42, and the third adhesive layer 32B may be formed by one film or may be formed by a plurality of films.

In a case where each of the first adhesive layer 31A, the first antireflection layer 41, and the second adhesive layer 31B is formed by one film, and each of the fourth adhesive layer 32A, the second antireflection layer 42, and the third adhesive layer 32B is formed by one film, for example, it is sufficient if the first adhesive layer 31A is a silicon oxide film (SiO film), the first antireflection layer 41 is a silicon nitride film (SiN film), the second adhesive layer 31B is a silicon oxide film (SiO film), the third adhesive layer 32B is a silicon nitride film (SiN film), the second antireflection layer 42 is a silicon oxide film (SiO film), and the fourth adhesive layer 32A is a silicon nitride film (SiN film).

In a case where each of the first adhesive layer 31A, the first antireflection layer 41, and the second adhesive layer 31B is formed by a plurality of films, and each of the fourth adhesive layer 32A, the second antireflection layer 42, and the third adhesive layer 32B is formed by a plurality of films, for example, it is sufficient if an interface film of the first adhesive layer 31A in contact with the first antireflection layer 41 is a silicon oxide film (SiO film), an interface film of the first antireflection layer 41 in contact with the first adhesive layer 31A is a silicon nitride film (SiN film), and an interface film of the second adhesive layer 31B in contact with the first antireflection layer 41 is a silicon oxide film (SiO film). Then, it is sufficient if an interface film of the third adhesive layer 32B in contact with the second antireflection layer 42 is a silicon nitride film (SiN film), an interface film of the second antireflection layer 42 in contact with the third adhesive layer 32B is a silicon oxide film (SiO film), and an interface film of the fourth adhesive layer 32A in contact with the second antireflection layer 42 is a silicon nitride film (SiN film).

Figure 7:
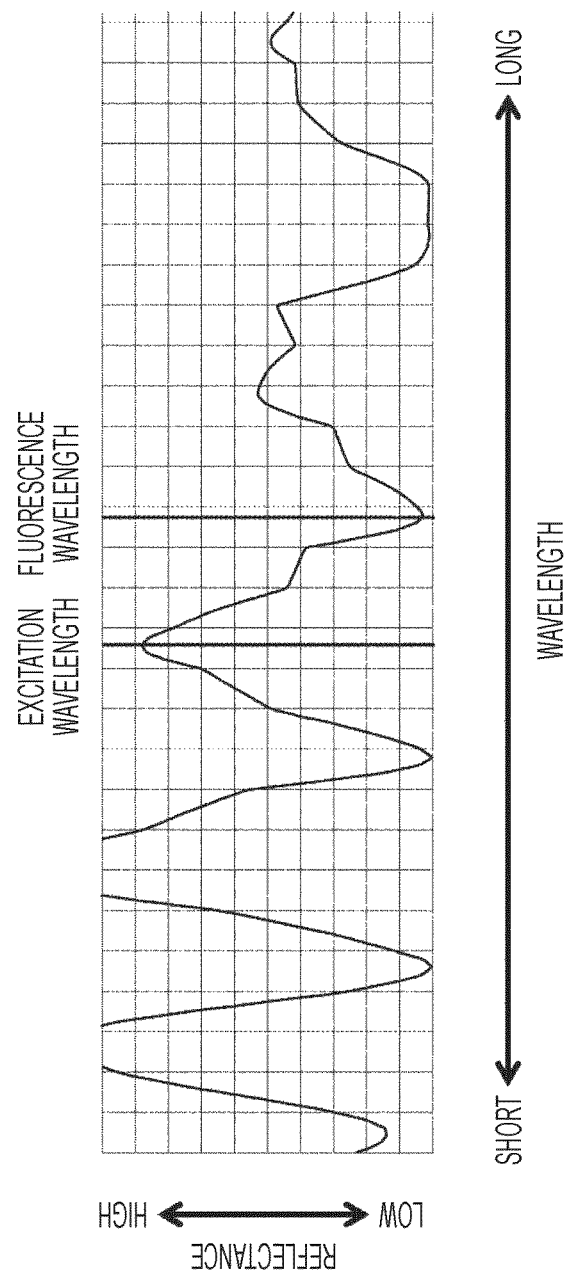
FIG. 7 is a diagram for explaining the relationship between reflectance and wavelength.

FIG. 7 is a graph of an example for explaining the relationship between the reflectance (vertical axis) and the wavelength (horizontal axis) in the imaging device of the first embodiment according to the present technology.

As illustrated in FIG. 7, the imaging device 1 (1-1, 1-2, 1-6) of the first embodiment according to the present technology has the effect of selectively shielding excitation light (high reflectance as illustrated in FIG. 7) and selectively transmitting fluorescence (low reflectance as illustrated in FIG. 7) by the antireflection layers 41 and 42. The antireflection layer 41 includes, for example, a silicon oxide film (SiO film) or a silicon nitride film (SiN film), and includes a light-shielding film that shields excitation light and/or a transmission film that transmits fluorescence emitted from the subject by the excitation light. The antireflection layer 42 includes, for example, a silicon oxide film (SiO film) or a silicon nitride film (SiN film), and includes a light-shielding film that shields excitation light and/or a transmission film that transmits fluorescence emitted from the subject by the excitation light. In a case where the subject is an ICG sample, the excitation light has a wavelength of 760 nm±10 nm, and the fluorescence has a wavelength of 850 nm±10 nm.

To the imaging device of the first embodiment according to the present technology, in addition to the contents described above, contents that will be described in the section of an imaging device of a second embodiment according to the present technology, which will be described later, can be applied as long as there are no particular technical contradictions.

3. Second Embodiment (Example 2 of Imaging Device)

An imaging device of the first embodiment (Example 2 of the imaging device) according to the present technology includes a first substrate including a first pixel array unit in which a plurality of pixels having at least a first photoelectric conversion unit that performs photoelectric conversion is arranged in a two-dimensional manner, a first wiring layer, and a first support layer stacked in this order, and a second substrate including a second pixel array unit in which a plurality of pixels having at least a second photoelectric conversion unit that performs photoelectric conversion is arranged in a two-dimensional manner, a second wiring layer, and a second support layer stacked in this order, in which the first support layer and the second support layer are bonded to each other to form a stacked structure of the first substrate and the second substrate, and at least one of the first support layer or the second support layer includes an antireflection layer, and a light emitting element that outputs excitation light with which a subject (for example, a sample) is irradiated is further included. The light emitting element may be, for example, an LED element, a laser element, or the like.

With the imaging device of the second embodiment (example 2 of the imaging device) according to the present technology, further improvement in image quality of the subject, particularly a lesion portion such as cancer, can be achieved. Specifically, with the imaging device of the second embodiment (example 2 of the imaging device) according to the present technology, an optical design capable of shielding excitation light and transmitting fluorescence can be achieved. Furthermore, since the imaging device of the second embodiment (example 2 of the imaging device) according to the present technology includes the light emitting element, it is possible to improve convenience at a time of surgery or the like.

Hereinafter, the imaging device of the second embodiment according to the present technology will be described using FIG. 8.

Figure 8:
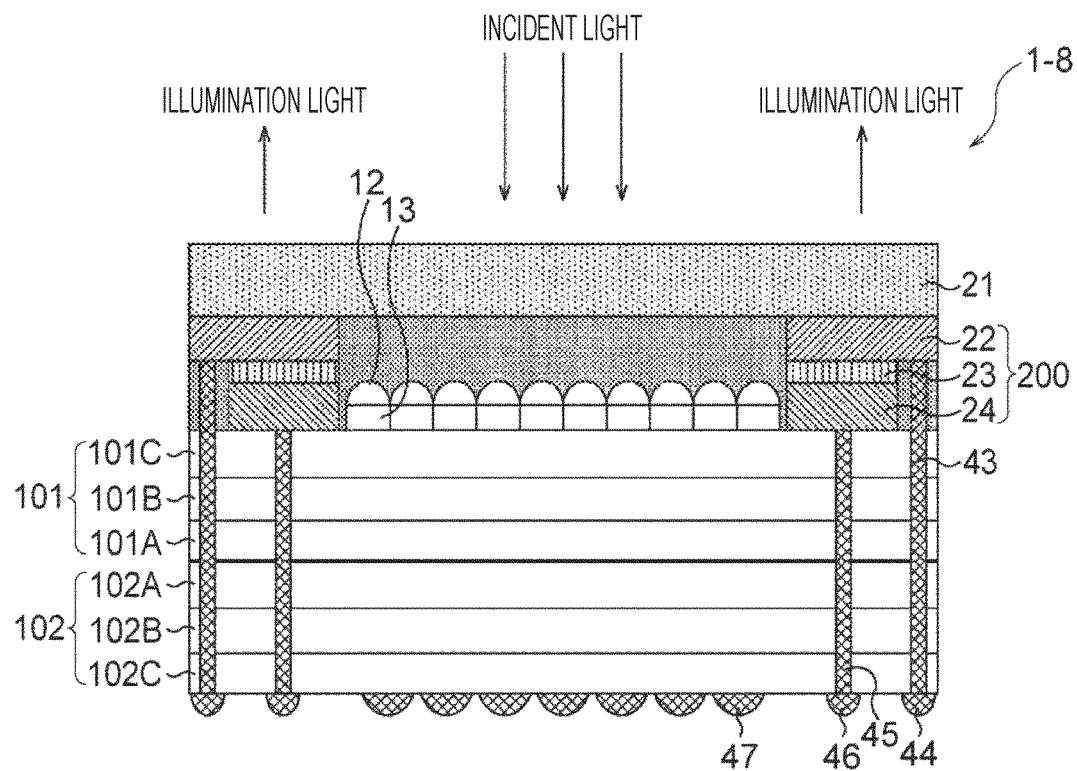
FIG. 8 is a cross-sectional view illustrating a configuration example of the imaging device to which the present technology is applied.

FIG. 8 is a cross-sectional view illustrating the imaging device 1-8 of the second embodiment according to the present technology.

The imaging device 1-8 includes a glass (for example, sapphire glass) 21, a first pixel array unit 101C having an on-chip lens 12, a color filter 13, and a first photoelectric conversion unit (for example, photodiode (PD)), a second pixel array unit 102 having a first wiring layer 101B, a first support layer 101A, a second support layer 102A, a second wiring layer 102B, and a second photoelectric conversion unit (for example, photodiode (PD)), and solder balls 47, in order from an incident side (incident light side) of light. Then, the imaging device 1-8 further includes a light emitting element (for example, a blue LED element) 200 (an n layer 22, a light emitting layer 23, and a p layer 24). The light emitting element 200 can output excitation light as irradiation light with which a subject (for example, an ICG sample) is irradiated. For example, fluorescence emitted from the subject (for example, an ICG sample) by the excitation light is photoelectrically converted by the second pixel array unit 102C to generate a pixel signal, and visible light is separated by the color filter 13 and photoelectrically converted by the first pixel array unit 101C to generate a pixel signal.

The imaging device 1-8 can be manufactured by, for example, a wafer-level chip size package (WCSP) manufacturing method such that a first substrate 101 and a second substrate 102 for a plurality of chips and a substrate on which the light emitting elements 200 for a plurality of chips are formed (not illustrated in FIG. 8) are bonded together. Then, by using the sapphire glass 21, which has higher strength compared to ordinary glass (for example, SiO glass), thinning of the cover glass and height reduction (module miniaturization) of the imaging device 1-8 as a whole can be achieved.

The on-chip lens 12 focuses incident light (for example, visible light) on the color filter 13. In the color filter 13, for example, respective color filters of R, G, and B are arranged according to a Bayer array.

In the first wiring layer 101B, a first wiring, a signal processing circuit that processes a pixel signal converted by the first pixel array unit 101C, an I/O circuit for taking out an external terminal, and the like are formed. The signal processing circuit, the I/O circuit, and the like formed in the first wiring layer 101B are arranged without protruding in a horizontal direction (left-right direction in FIG. 8) from the area occupied by the first pixel array unit 101C on an upper layer side (upper side in FIG. 8).

Furthermore, in the second wiring layer 102B, a second wiring, a signal processing circuit that processes a pixel signal converted by the second pixel array unit 102C, an I/O circuit for taking out an external terminal, and the like are formed. The signal processing circuit, I/O circuit, and the like formed in the second wiring layer 102B are arranged without protruding in the horizontal direction (left-right direction in FIG. 8) from the area occupied by the second pixel array unit 102C on a lower layer side (lower side in FIG. 8).

The imaging device 1-8 is connected to the outside via solder balls 47. A voltage is applied to the light emitting element 200 via solder balls 44 and silicon vias (through electrodes) 43, and solder balls 46 and vias 45, and the light emitting element 200 outputs irradiation light (excitation light) according to the applied voltage.

To the imaging device of the second embodiment according to the present technology, in addition to the contents described above, the contents described in the section of the solid-state imaging device of the first embodiment according to the present technology described above can be applied as they are as long as there are no particular technical contradictions.

4. Third Embodiment (Example of Electronic Device)

An electronic device of a third embodiment according to the present technology is an electronic device equipped with the imaging device of either one of the first and second embodiments according to the present technology. Hereinafter, specific examples of the electronic device of the third embodiment according to the present technology (application example of the imaging device to which the present technology is applied) will be described in detail.

5. Application Example of Imaging Device to Which Present Technology is Applied

[5-1. Configuration Example of Camera System]

Figure 9:
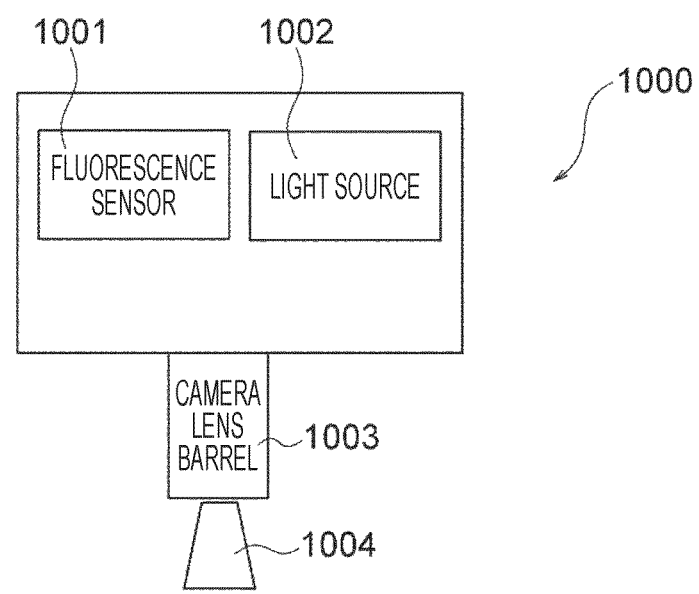
FIG. 9 is a diagram illustrating a configuration example of a camera system using the imaging device to which the present technology is applied.

The imaging devices of the first and second embodiments according to the present technology can be applied to a camera system. FIG. 9 is a diagram illustrating a configuration example of a camera system 1000 to which the imaging device of the first embodiment according to the present technology is applied. The camera system 1000 includes a fluorescence sensor 1001, a light source 1002, and a camera lens barrel 1003. The light source 1002 irradiates a subject (for example, an ICG sample) 1004 with excitation light. The imaging device of the first embodiment according to the present technology is used as the fluorescence sensor 1001, and the light source 1002 is, for example, a xenon light source, an LED light source, an LD light source, or the like.

[5-2. Example of Application to Internal Information Acquisition System Including Capsule-Type Endoscope]

The imaging devices of the first and second embodiments according to the present technology can be applied to an electronic device for ICG (indocyanine green) (fluorescence imaging method) observation in medical applications. In the ICG observation, the excitation light is 760 nm and the fluorescence is 850 nm, and thus in the case of the imaging device of the second embodiment according to the present technology, it is only required to use one that outputs light having a wavelength of 760 nm is used for the light emitting element.

In the ICG observation, it is desirable that spectral ripples are small due to a narrow wavelength band of low sensitivity. The spectral ripples are generated by interference of a reflection interface, but the spectral ripples can be significantly suppressed in the imaging device of the first and second embodiments according to the present technology. Specifically, for example, the ICG wavelength ripples can be minimized by designing an antireflection film having a film thickness d=wavelength $\lambda/(4\times$refractive index n) by using a material having an intermediate refractive index of a refractive index n=1 to 1.7 of air and the sapphire glass 21 on the outermost surface.

Note that in the case of the imaging device of the second embodiment according to the present technology, the antireflection film can be formed simultaneously, which has been conventionally processed separately for the first substrate and the second substrate and the light emitting element included in the imaging device of the second embodiment according to the present technology.

Figure 11:
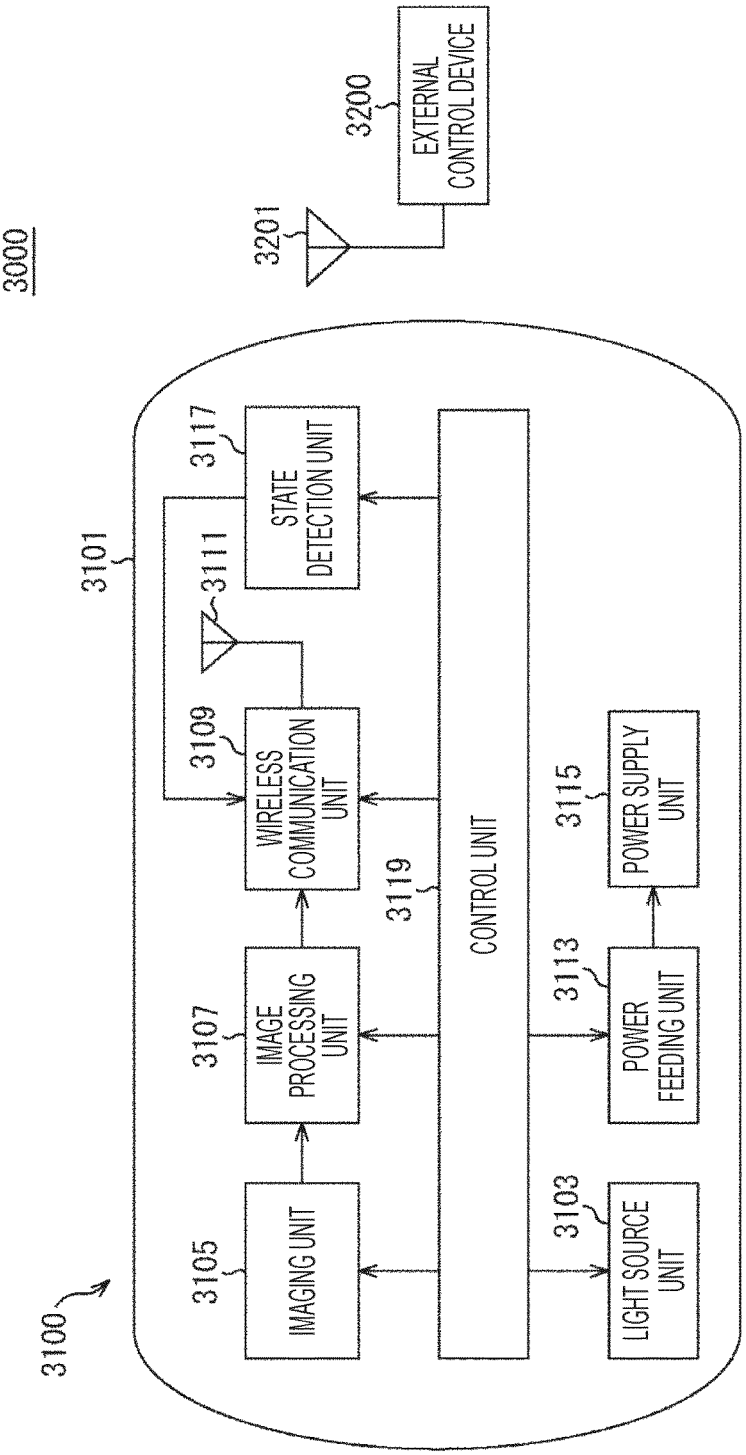
FIG. 11 is a block diagram illustrating a configuration example of an internal information acquisition system including a capsule-type endoscope using the imaging device to which the present technology is applied.

FIG. 11 illustrates a schematic configuration example of an internal information acquisition system for patient using a capsule-type endoscope in a case where the imaging devices of the first and second embodiments according to the present technology are applied to a capsule-type endoscope.

The internal information acquisition system 3000 includes a capsule-type endoscope 3100 swallowed by the patient at the time of examination and an external control device 3200 that integrally controls the operation of the internal information acquisition system 3000.

The capsule-type endoscope 3100 has an imaging function and a wireless communication function and, while moving inside an organ such as a stomach and an intestine by peristaltic movement or the like until it is naturally excreted from the patient, sequentially captures images inside the organ (hereinafter, also referred to as internal images) at predetermined intervals, and sequentially transmits information regarding the internal images wirelessly to the external control device 3200 outside the body.

The external control device 3200 generates image data for displaying the internal images on a display device (not illustrated) on the basis of the received information regarding the internal images.

In the internal information acquisition system 3000, in this manner, it is possible to obtain an image of the inside of the body of the patient at any time from the time when the capsule-type endoscope 3100 is swallowed until it is excreted.

Configurations and functions of the capsule-type endoscope 3100 and the external control device 3200 will be described in detail.

The capsule-type endoscope 3100 is equipped with functions of a light source unit 3103, an imaging unit 3105, an image processing unit 3107, a wireless communication unit 3109, a power feeding unit 3113, a power supply unit 3115, a state detection unit 3117, and a control unit 3119 in a capsule-type housing 3101.

The light source unit 3103 emits light to an imaging field of view of the imaging unit 3105. The imaging unit 3105 receives reflected light of light with which a body tissue as an observation target is irradiated and performs photoelectric conversion thereof to generate an electrical signal corresponding to observation light, that is, an image signal corresponding to the observation image. The image signal generated by the imaging unit 3105 is provided to the image processing unit 3107.

The imaging device of the first embodiment according to the present technology is used as the imaging unit 3105, and the imaging device of the second embodiment according to the present technology is used as the light source unit 3103 and the imaging unit 3105.

The image processing unit 3107 includes processors such as a central processing unit (CPU) and a graphics processing unit (GPU), and performs various signal processing on the image signal generated by the imaging unit 3105. The signal processing may be minimum processing for transmitting the image signal to the external control device 3200 (for example, compression of image data, conversion of frame rate, conversion of data rate and/or conversion of format, and the like). Since the image processing unit 3107 is configured to perform only the minimum necessary processing, the image processing unit 3107 can be achieved in a smaller size and with lower power consumption, and hence is preferable for the capsule-type endoscope 3100. However, if there is enough space in the housing 3101 or power consumption margin, the image processing unit 3107 may perform further signal processing (for example, noise removal processing, other high image quality processing, or the like).

The image processing unit 3107 provides the image signal subjected to the signal processing to the wireless communication unit 3109 as RAW data. Note that in a case where information regarding the state (movement, posture, and the like) of the capsule-type endoscope 3100 is acquired by the state detection unit 3117, the wireless communication unit 3109 may provide the image signal to the wireless communication unit 3109 by associating with this information. Thus, a position in the body where an image is captured, an imaging direction of the image, and the like can be associated with the captured image.

The wireless communication unit 3109 includes a communication device capable of transmitting and receiving various information to and from the external control device 3200. The communication device includes an antenna 3111 and a processing circuit or the like that performs modulation processing or the like for transmitting and receiving signals. The wireless communication unit 3109 performs predetermined processing such as modulation processing on the image signal that has been subjected to the signal processing by the image processing unit 3107, and transmits the image signal to the external control device 3200 via the antenna 3111. Furthermore, the wireless communication unit 3109 receives a control signal related to drive control of the capsule-type endoscope 3100 from the external control device 3200 via the antenna 3111. The wireless communication unit 3109 provides the received control signal to the camera head control unit 3119.

The power feeding unit 3113 includes an antenna coil for receiving power, a power regeneration circuit that regenerates electric power from the current generated in the antenna coil, a booster circuit, and the like. In the power feeding unit 3113, electric power is generated using what is called non-contact charging principle. Specifically, when a magnetic field (electromagnetic wave) having a predetermined frequency is applied to the antenna coil of the power feeding unit 3113 from the outside, an induced electromotive force is generated in the antenna coil. The electromagnetic wave may be, for example, a carrier wave transmitted from the external control device 3200 via an antenna 3201. Electric power is regenerated from the induced electromotive force by the power regeneration circuit, and the potential thereof is appropriately adjusted in the booster circuit to generate electric power for storage. The electric power generated by the power feeding unit 3113 is stored in the power supply unit 3115.

The power supply unit 3115 includes a secondary battery and stores the electric power generated by the power feeding unit 3113. However, in FIG. 11, the illustration of an arrow or the like indicating the destination of power supply from the power supply unit 3115 is omitted.

The state detection unit 3117 includes sensors, such as an acceleration sensor and/or a gyro sensor, for detecting the state of the capsule-type endoscope 3100. The state detection unit 3117 can acquire information regarding the state of the capsule-type endoscope 3100 from detection results by the sensors. The state detection unit 3117 provides the image processing unit 3107 with the acquired information regarding the state of the capsule-type endoscope 3100. In the image processing unit 3107, as described above, information regarding the state of the capsule-type endoscope 3100 can be associated with the image signal.

The control unit 3119 includes a processor such as a CPU, and integrally controls the operation of the capsule-type endoscope 3100 by operating according to a predetermined program. The control unit 3119 implements the functions in respective units as described above by appropriately controlling driving of the light source unit 3103, the imaging unit 3105, the image processing unit 3107, the wireless communication unit 3109, the power feeding unit 3113, the power supply unit 3115, and the state detection unit 3117 according to a control signal transmitted from the external control device 3200.

The external control device 3200 may be a processor such as a CPU or GPU, or a microcomputer or a control board or the like on which a processor and a storage element such as a memory are mounted in a mixed manner. The external control device 3200 has an antenna 3201 and is configured to be capable of transmitting and receiving various information to and from the capsule-type endoscope 3100 via the antenna 3201.

Specifically, the external control device 3200 controls the operation of the capsule-type endoscope 3100 by transmitting a control signal to the control unit 3119 of the capsule-type endoscope 3100. For example, the control signal from the external control device 3200 can change irradiation conditions of light with respect to the observation target in the light source unit 3103. Further, the imaging conditions (for example, the frame rate, the exposure value, and the like in the imaging unit 3105) can be changed by the control signal from the external control device 3200. Furthermore, the contents of processing in the image processing unit 3107 and conditions for transmitting the image signal by the wireless communication unit 3109 (for example, transmission interval, number of transmitted images, and the like) may be changed by the control signal from the external control device 3200.

Furthermore, the external control device 3200 performs various image processing on the image signal transmitted from the capsule-type endoscope 3100, and generates image data for displaying the captured internal image on the display device. As the image processing, for example, various known signal processing such as development processing (demosaic processing), image quality enhancement processing (band enhancement processing, super-resolution processing, noise reduction (NR) processing, and/or camera shake correction processing, and the like), and/or enlargement processing (electronic zoom processing) and the like may be performed. The external control device 3200 controls driving of the display device (not illustrated) to display an internal image captured on the basis of the generated image data. Alternatively, the external control device 3200 may have the generated image data recorded in a recording device (not illustrated) or printed out by a printing device (not illustrated).

[5-3. Example of Using Imaging Device]

Figure 12:
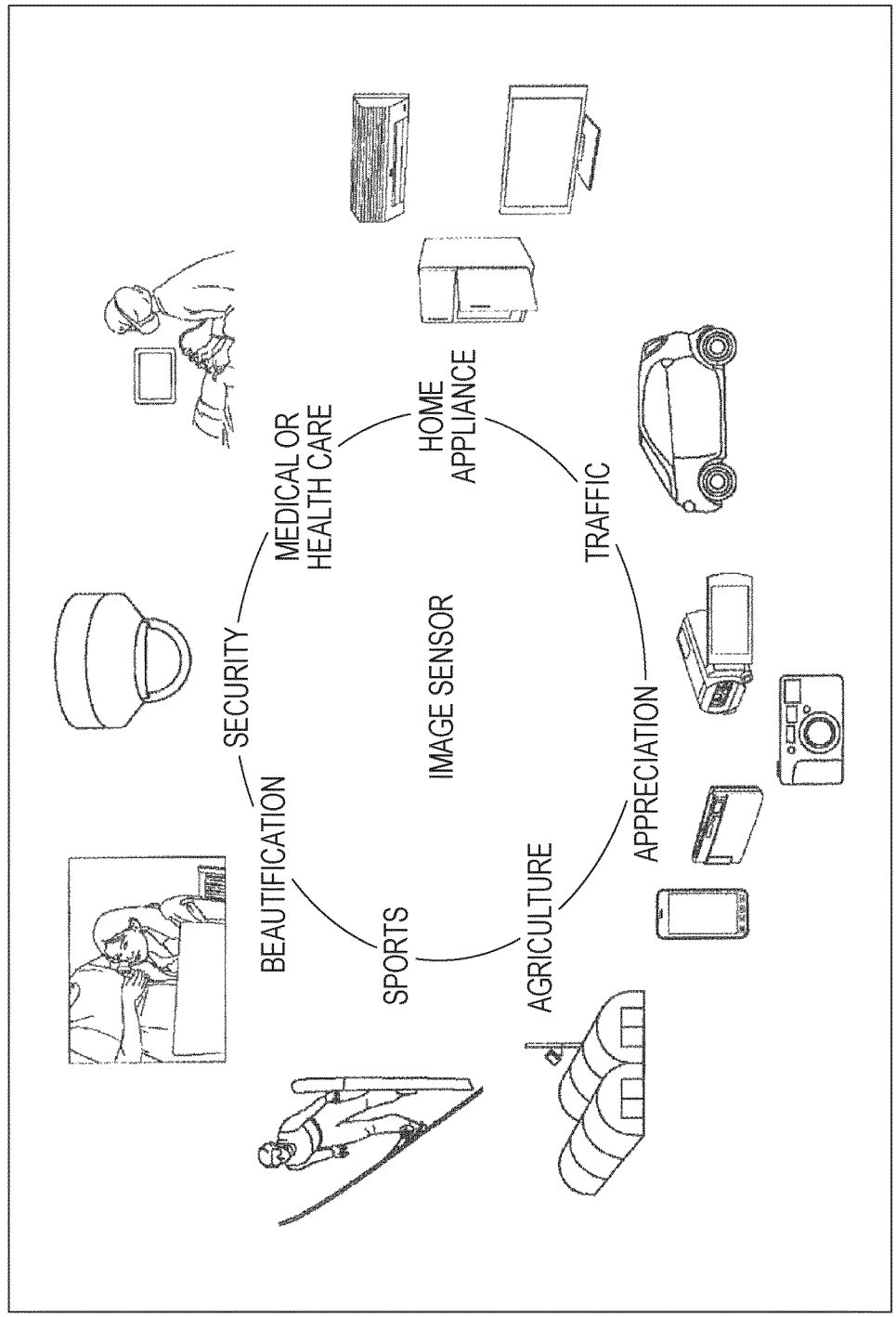
FIG. 12 is a diagram illustrating an example of using an imaging device to which the present technology is applied.

FIG. 12 is a diagram illustrating an example of using the imaging devices of the first and second embodiments according to the present technology as an image sensor.

The imaging devices of the first and second embodiments described above can be used in various cases of sensing light such as visible light, infrared light, ultraviolet light, and X-ray, as described below, for example. That is, as illustrated in FIG. 12, for example, the imaging device of either one of the first and second embodiments can be used in devices (for example, the electronic device of the third embodiment described above) used in the field of appreciation for taking an image used for appreciation, the field of traffic, the field of home appliances, the field of medical or health care, the field of security, the field of beautification, the field of sports, the field of agriculture, and the like.

Specifically, in the field of appreciation, for example, the imaging device of either one of the first and second embodiments can be used in devices for taking images to be used for appreciation, such as digital cameras, smartphones, and mobile phones with a camera function.

In the field of traffic, for example, the imaging device of either one of the first and second embodiments can be used in devices for traffic use, such as an onboard sensor that captures images of the front side, the rear side, the surroundings, the inside, and the like of an automobile, a monitoring camera that monitors a traveling vehicle and a road, and a range sensor that measures distance between vehicles for safe driving such as automatic stop and recognition of a state of a driver.

In the field of home appliances, for example, the imaging device of either one of the first and second embodiments can be used in devices for home appliances such as a television receiver, a refrigerator, and an air conditioner for capturing a gesture of a user and performing a device operation in accordance with the gesture.

In the field of medical or health care, for example, the imaging device of either one of the first and second embodiments can be used in devices for medical or healthcare use, such as an endoscope or a device that perform angiography by receiving infrared light.

In the field of security, for example, the imaging device of either one of the first and second embodiments can be used in devices for security use such as a surveillance camera for crime prevention or a camera for personal identification.

In the field of beautification, for example, the imaging device of either one of the first and second embodiments can be used in devices used for beautification, such as a skin measuring device that captures an image of the skin, and a microscope that captures an image of the scalp.

In the field of sports, for example, the imaging device of either one of the first and second embodiments can be used in devices for sports use such as an action camera or a wearable camera for sports use or the like.

In the field of agriculture, for example, the imaging device according to either one of the first and second embodiments can be used in devices for agricultural use, such as a camera for monitoring the state of a field or a crop.

[5-4. Example of Application to Endoscopic Surgery System]

The present technology can be applied to various products. For example, the technology according to the present disclosure (the present technology) may be applied to an endoscopic surgery system.

Figure 13:
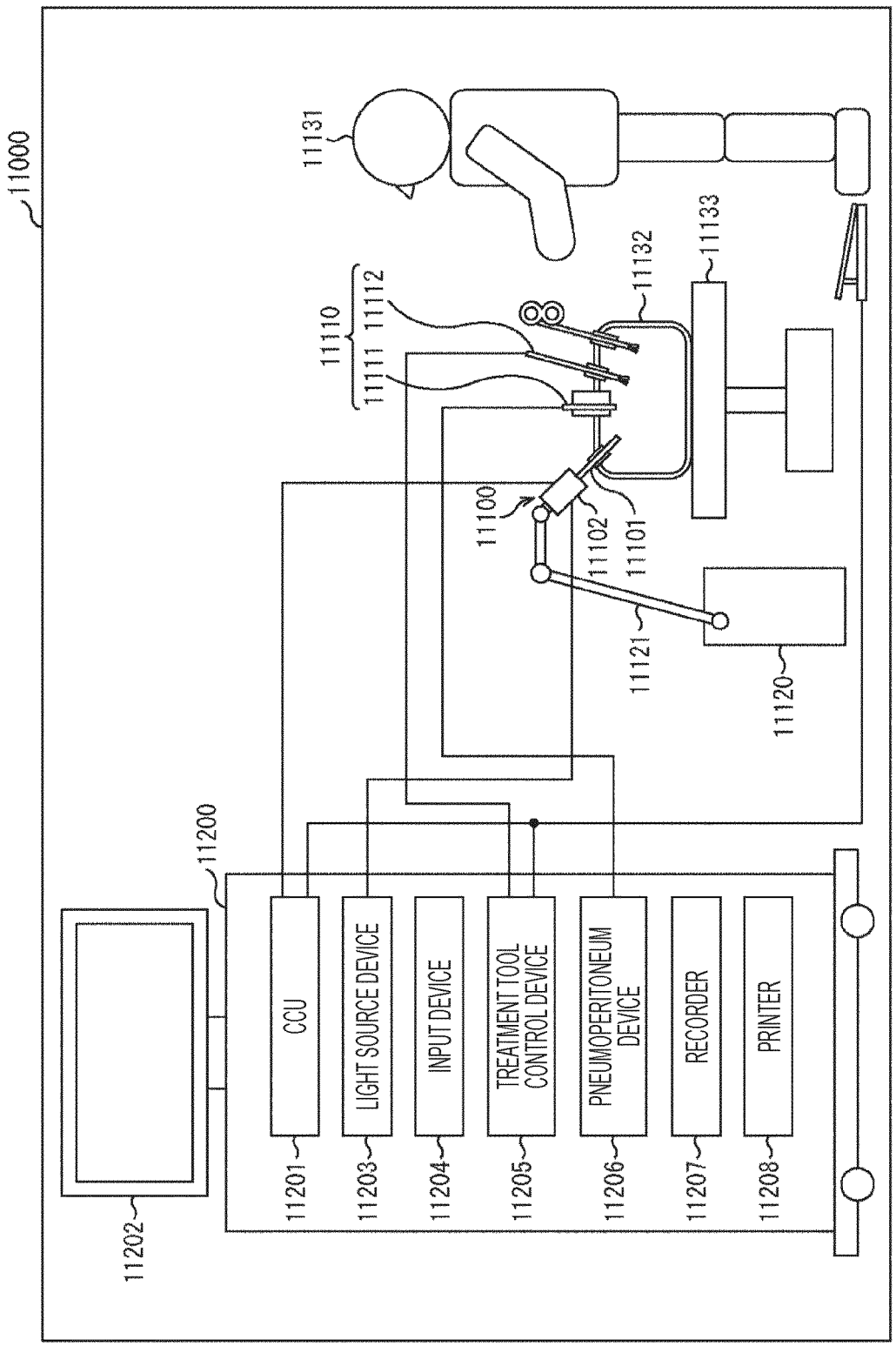
FIG. 13 is a diagram illustrating an example of a schematic configuration of an endoscopic surgery system.

FIG. 13 is a diagram illustrating an example of a schematic configuration of an endoscopic surgery system to which the technology according to the present disclosure (the present technology) can be applied.

FIG. 13 illustrates that an operator (doctor) 11131 performing surgery on a patient 11132 on a patient bed 11133 using an endoscopic surgery system 11000. As illustrated in the diagram, the endoscopic surgery system 11000 includes an endoscope 11100, other surgical tools 11110 such as a pneumoperitoneum tube 11111 and an energy treatment device 11112, a support arm device 11120 that supports the endoscope 11100, and a cart 11200 on which various devices for endoscopic surgery are mounted.

The endoscope 11100 includes a lens barrel 11101 having a region with a predetermined length from a distal end to be inserted into the body cavity of the patient 11132, and a camera head 11102 connected to a base end of the lens barrel 11101. In the illustrated example, the endoscope 11100 configured as what is called a rigid endoscope having a rigid lens barrel 11101 is illustrated, but the endoscope 11100 may be configured as what is called a flexible mirror having a flexible lens barrel.

An opening in which an objective lens is fitted is provided in the distal end of the lens barrel 11101. A light source device 11203 is connected to the endoscope 11100, and light generated by the light source device 11203 is guided to the distal end of the lens barrel by a light guide extending inside the lens barrel 11101, and is emitted toward an observation target in the body cavity of the patient 11132 through the objective lens. Note that the endoscope 11100 may be a forward-viewing endoscope, an oblique-viewing endoscope, or a side-viewing endoscope.

An optical system and an imaging element are provided inside the camera head 11102, and reflected light (observation light) from the observation target is focused on the imaging element by the optical system. The observation light is photoelectrically converted by the imaging element, and an electrical signal corresponding to the observation light, that is, an image signal corresponding to an observation image is generated. The image signal is transmitted as RAW data to a camera control unit (CCU) 11201.

The CCU 11201 includes a central processing unit (CPU), a graphics processing unit (GPU), and the like, and integrally controls operations of the endoscope 11100 and the display device 11202. Moreover, the CCU 11201 receives an image signal from the camera head 11102 and subjects the image signal to various image processing such as development processing (demosaic processing) for example for displaying an image based on the image signal.

By control from the CCU 11201, the display device 11202 displays an image based on the image signal subjected to the image processing by the CCU 11201.

The light source device 11203 includes, for example, a light source such as a light emitting diode (LED), and supplies the endoscope 11100 with irradiation light at the time of capturing an image of the surgical site.

The input device 11204 is an input interface for the endoscopic surgery system 11000. The user can input various information and instructions to the endoscopic surgery system 11000 via the input device 11204. For example, the user inputs an instruction to change the imaging conditions (type of irradiation light, magnification, focal length, and the like) by the endoscope 11100.

A treatment tool control device 11205 controls driving of the energy treatment device 11112 for cauterization of tissue, incision, sealing of blood vessel, or the like. A pneumoperitoneum device 11206 delivers gas into the body cavity through the pneumoperitoneum tube 11111 in order to inflate the body cavity of the patient 11132 for the purpose of securing the field of view by the endoscope 11100 and the working space of the operator. A recorder 11207 is a device capable of recording various information regarding surgery. A printer 11208 is a device capable of printing various information regarding surgery in various formats such as text, image, or graph.

Note that the light source device 11203 that supplies the endoscope 11100 with the irradiation light at the time of capturing an image of the surgical site can include, for example, a white light source formed by an LED, a laser light source, or a combination thereof. In a case where the white light source is formed by a combination of RGB laser light sources, the output intensity and output timing of each color (each wavelength) can be controlled with high accuracy, and thus white balance of a captured image can be adjusted in the light source device 11203. Furthermore, in this case, it is possible to irradiate the observation target with the laser light from each of the RGB laser light sources in a time-division manner, and control driving of the imaging element of the camera head 11102 in synchronization with the irradiation timing, to thereby capture an image corresponding to each of RGB in a time-division manner. According to this method, a color image can be obtained without providing a color filter on the imaging element.

Furthermore, driving of the light source device 11203 may be controlled so as to change the intensity of output light at every predetermined time interval. By controlling driving of the imaging element of the camera head 11102 in synchronization with timing of changing the intensity of the light to acquire images in a time-division manner and synthesizing the images, images with high dynamic ranges without what is called blocked up shadows and blown out highlights can be generated.

Furthermore, the light source device 11203 may be capable of supplying light in a predetermined wavelength band corresponding to special light observation. In the special light observation, for example, what is called narrow band light observation (narrow band imaging) is performed by utilizing the wavelength dependence of light absorption in body tissue and emitting light in a narrower band as compared with irradiation light in normal observation (that is, white light), to thereby image a predetermined tissue such as blood vessels on a surface layer of a mucous membrane with high contrast. Alternatively, in the special light observation, fluorescence observation in which an image is obtained by fluorescence generated by emitting excitation light may be performed. In the fluorescence observation, it is possible to perform irradiating a body tissue with excitation light to observe fluorescence from the body tissue (autofluorescence observation), or locally injecting a reagent such as indocyanine green (ICG) into a body tissue and irradiating the body tissue with excitation light corresponding to the fluorescence wavelength of the reagent to obtain a fluorescence image, or the like. The light source device 11203 may be capable of supplying narrowband light and/or excitation light compatible with such special light observation.

Figure 14:
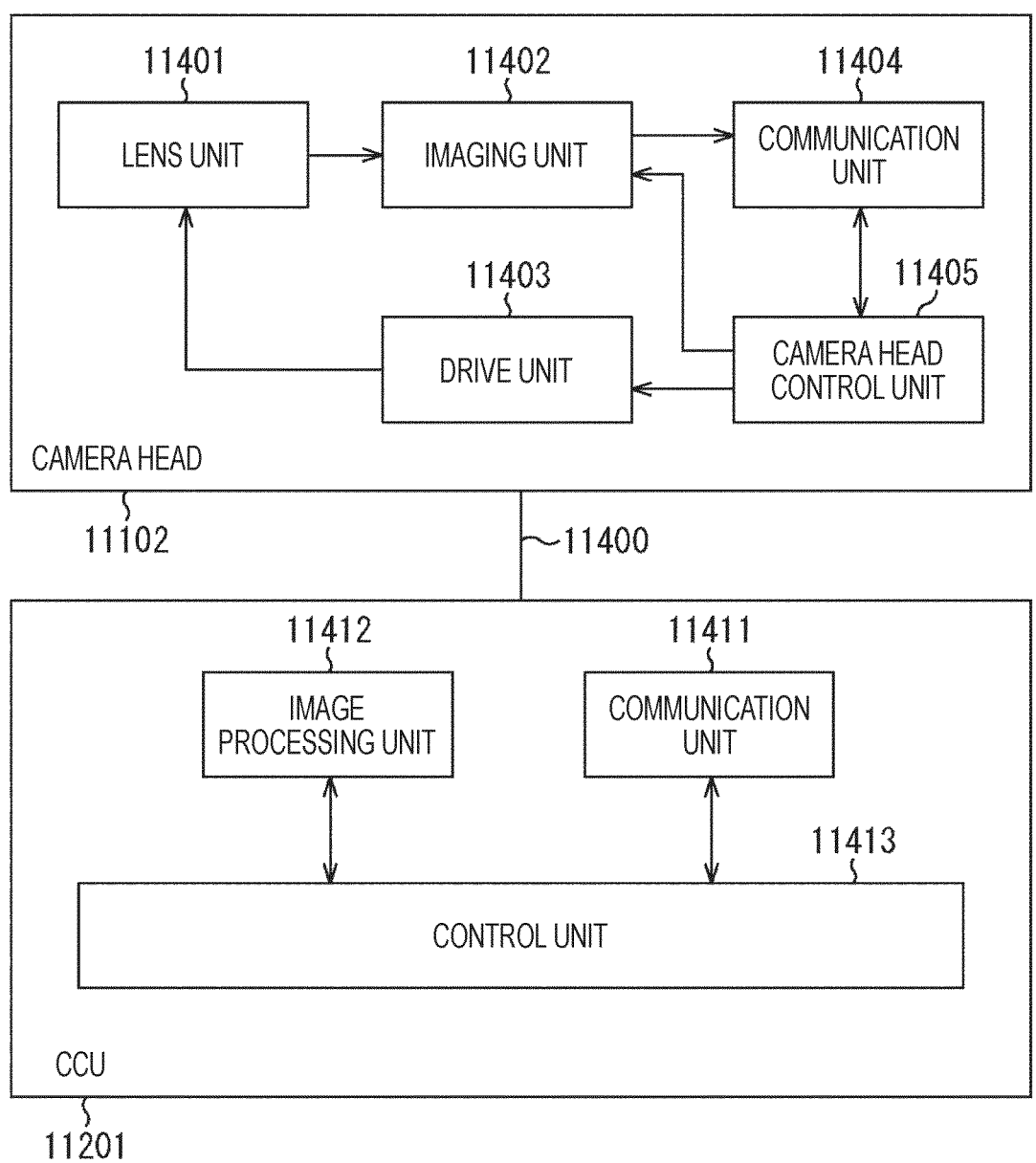
FIG. 14 is a block diagram illustrating an example of a functional configuration of a camera head and a CCU.

FIG. 14 is a block diagram illustrating an example of functional configurations of the camera head 11102 and the CCU 11201 illustrated in FIG. 13.

The camera head 11102 includes a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are connected in a mutually communicable manner by a transmission cable 11400.

The lens unit 11401 is an optical system provided at a connection portion with the lens barrel 11101. The observation light taken in from the distal end of the lens barrel 11101 is guided to the camera head 11102 and incident on the lens unit 11401. The lens unit 11401 is configured by combining a plurality of lenses including a zoom lens and a focus lens.

The imaging unit 11402 is formed by an imaging device (imaging element). The imaging element constituting the imaging unit 11402 may be one (what is called a single plate type) or multiple (what is called a multi-plate type). In a case where the imaging unit 11402 is formed by a multi-plate type, for example, each imaging element may generate an image signal corresponding to each of RGB, and a color image may be obtained by synthesizing them. Alternatively, the imaging unit 11402 may have a pair of imaging elements for acquiring respective image signals for the right eye and the left eye corresponding to 3-dimensional (3D) display. Performing the 3D display enables the operator 11131 to more accurately grasp the depth of living tissue at a surgical site. Note that in a case where the imaging unit 11402 includes a multi-plate type, multiple systems of lens units 11401 are provided corresponding to the respective imaging elements.

Furthermore, the imaging unit 11402 does not necessarily have to be provided in the camera head 11102. For example, the imaging unit 11402 may be provided inside the lens barrel 11101 immediately after the objective lens.

The drive unit 11403 includes an actuator, and moves the zoom lens and the focus lens of the lens unit 11401 by a predetermined distance along the optical axis under the control of the camera head control unit 11405. Thus, the magnification and focus of the image captured by the imaging unit 11402 can be adjusted as appropriate.

The communication unit 11404 includes a communication device for transmitting and receiving various information to and from the CCU 11201. The communication unit 11404 transmits an image signal obtained from the imaging unit 11402 as RAW data to the CCU 11201 via the transmission cable 11400.

Furthermore, the communication unit 11404 receives a control signal for controlling driving of the camera head 11102 from the CCU 11201 and supplies the control signal to the camera head control unit 11405. The control signal includes, for example, information regarding imaging conditions such as information specifying the frame rate of the captured image, information specifying the exposure value at the time of imaging, and/or information specifying the magnification and focus of the captured image.

Note that the above imaging conditions such as the frame rate, exposure value, magnification, and focus described above may be appropriately specified by the user, or may be automatically set by the control unit 11413 of the CCU 11201 on the basis of the acquired image signal. In the latter case, the endoscope 11100 is equipped with what is called an auto exposure (AE) function, an auto focus (AF) function, and an auto white balance (AWB) function.

The camera head control unit 11405 controls driving of the camera head 11102 on the basis of the control signal from the CCU 11201 received via the communication unit 11404.

The communication unit 11411 includes a communication device for transmitting and receiving various information to and from the camera head 11102. The communication unit 11411 receives an image signal transmitted from the camera head 11102 via the transmission cable 11400.

Furthermore, the communication unit 11411 transmits to the camera head 11102 a control signal for controlling driving of the camera head 11102. Image signals and control signals can be transmitted by electrical communication, optical communication, or the like.

The image processing unit 11412 subjects the image signal that is RAW data transmitted from the camera head 11102 to various image processing.

The control unit 11413 performs various control related to imaging of the surgical site or the like by the endoscope 11100 and display of a captured image obtained by the imaging of the surgical site or the like. For example, the control unit 11413 generates a control signal for controlling driving of the camera head 11102.

Furthermore, the control unit 11413 causes the display device 11202 to display the captured image of the surgical site or the like on the basis of the image signal subjected to the image processing by the image processing unit 11412. At this time, the control unit 11413 may recognize various objects in the captured image using various image recognition techniques. For example, the control unit 11413 can detect the shapes of edges, colors, and the like of an object included in the captured image, to thereby recognize a surgical tool such as forceps, a specific biological part, bleeding, mist when using the energy treatment device 11112, or the like. When causing the display device 11202 to display the captured image, the control unit 11413 may use a recognition result thereof to superimpose various surgical support information on the image of the surgical site. By the surgical support information superimposed and presenting to the operator 11131, the burden on the operator 11131 can be reduced and the operator 11131 can surely proceed with the surgery.

The transmission cable 11400 that connects the camera head 11102 and the CCU 11201 is an electrical signal cable compatible with electrical signal communication, an optical fiber compatible with optical communication, or a composite cable thereof.

Here, although the communication is performed by wire using the transmission cable 11400 in the illustrated example, the communication between the camera head 11102 and the CCU 11201 may be performed wirelessly.

The example of the endoscopic surgery system to which the technology according to the present disclosure can be applied has been described above. The technology according to the present disclosure can be applied to the endoscope 11100, (the imaging unit 11402 of) the camera head 11102, and the like among the configurations described above. Specifically, the solid-state imaging device 111 of the present disclosure can be applied to the imaging unit 10402. By applying the technology according to the present disclosure to the endoscope 11100, (the imaging unit 11402 of) the camera head 11102, and the like, it is possible to improve yield and reduce cost related to manufacturing.

Here, the endoscopic surgery system has been described as an example, but the technology according to the present disclosure may be applied to other, for example, microscopic surgery systems and the like.

Note that the present technology is not limited to the above-described embodiments and application examples, and various modifications are possible without departing from the gist of the present technology.

Furthermore, the effects described in the present description are merely examples and are not limited, and other effects may be provided.

Furthermore, the present technology can also employ the following configurations.

[1]

An imaging device including:
  a first substrate including a first pixel array unit in which a plurality of pixels having at least a first photoelectric conversion unit that performs photoelectric conversion is arranged in a two-dimensional manner, a first wiring layer, and a first support layer stacked in this order; and
  a second substrate including a second pixel array unit in which a plurality of pixels having at least a second photoelectric conversion unit that performs photoelectric conversion is arranged in a two-dimensional manner, a second wiring layer, and a second support layer stacked in this order,
  in which the first support layer and the second support layer are bonded to each other to form a stacked structure of the first substrate and the second substrate, and
  at least one of the first support layer or the second support layer includes an antireflection layer.

[2]

The imaging device according to [1], in which the antireflection layer includes a light-shielding film that shields excitation light with which a subject is irradiated and/or a transmission film that transmits fluorescence emitted from the subject by the excitation light.

[3]

The imaging device according to [2], in which the excitation light has a wavelength of 760 nm±10 nm, and the fluorescence has a wavelength of 850 nm±10 nm.

[4]

The imaging device according to [1], in which the first support layer includes a first antireflection layer, and the second support layer includes a second antireflection layer.

[5]

The imaging device according to [4], in which
  the first antireflection layer includes a light-shielding film that shields excitation light with which a subject is irradiated and/or a transmission film that transmits fluorescence emitted from the subject by the excitation light, and
  the second antireflection layer includes a light-shielding film that shields excitation light with which a subject is irradiated and/or a transmission film that transmits fluorescence emitted from the subject by the excitation light.

[6]

The imaging device according to [5], in which the excitation light has a wavelength of 760 nm±10 nm, and the fluorescence has a wavelength of 850 nm±10 nm.

[7]
The imaging device according to [1], in which the first support layer includes a first adhesive layer, a first antireflection layer, and a second adhesive layer stacked in this order, and the second adhesive layer and the second support layer are bonded to each other to form a stacked structure of the first substrate and the second substrate.

[8]
The imaging device according to [7], in which the first antireflection layer includes a light-shielding film that shields excitation light with which a subject is irradiated and/or a transmission film that transmits fluorescence emitted from the subject by the excitation light.

[9]
The imaging device according to [8], in which the excitation light has a wavelength of 760 nm±10 nm, and the fluorescence has a wavelength of 850 nm±10 nm.

[10]
The imaging device according to any one of [7] to [9], in which the first adhesive layer includes a silicon oxide film, the first antireflection layer includes a silicon nitride film, and the second adhesive layer includes a silicon oxide film.

[11]
The imaging device according to any one of [7] to [9], in which the first adhesive layer includes a silicon nitride film, the first antireflection layer includes a silicon oxide film, and the second adhesive layer includes a silicon nitride film.

[12]
The imaging device according to [1], in which the second support layer includes a third adhesive layer, a second antireflection layer, and a fourth adhesive layer stacked in this order, and the third adhesive layer and the first support layer are bonded to each other to form a stacked structure of the first substrate and the second substrate.

[13]
The imaging device according to [12], in which the second antireflection layer includes a light-shielding film that shields excitation light with which a subject is irradiated and/or a transmission film that transmits fluorescence emitted from the subject by the excitation light.

[14]
The imaging device according to [13], in which the excitation light has a wavelength of 760 nm±10 nm, and the fluorescence has a wavelength of 850 nm±10 nm.

[15]
The imaging device according to any one of [12] to [14], in which the third adhesive layer includes a silicon oxide film, the second antireflection layer includes a silicon nitride film, and the fourth adhesive layer includes a silicon oxide film.

[16]
The imaging device according to any one of [12] to [14], in which the third adhesive layer includes a silicon nitride film, the second antireflection layer includes a silicon oxide film, and the fourth adhesive layer includes a silicon nitride film.

[17]
The imaging device according to [1], in which
the first support layer includes a first adhesive layer, a first antireflection layer, and a second adhesive layer stacked in this order,
the second support layer includes a third adhesive layer, a second antireflection layer, and a fourth adhesive layer stacked in this order, and
the second adhesive layer and the third adhesive layer are bonded to each other to form a stacked structure of the first substrate and the second substrate.

[18]
The imaging device according to [17], in which
the first antireflection layer includes a light-shielding film that shields excitation light with which a subject is irradiated and/or a transmission film that transmits fluorescence emitted from the subject by the excitation light, and
the second antireflection layer includes a light-shielding film that shields excitation light with which a subject is irradiated and/or a transmission film that transmits fluorescence emitted from the subject by the excitation light.

[19]
The imaging device according to [18], in which the excitation light has a wavelength of 760 nm±10 nm, and the fluorescence has a wavelength of 850 nm±10 nm.

[20]
The imaging device according to any one of [17] to [19], in which
the first adhesive layer includes a silicon oxide film, the first antireflection layer includes a silicon nitride film, and the second adhesive layer includes a silicon oxide film, and
the third adhesive layer includes a silicon nitride film, the second antireflection layer includes a silicon oxide film, and the fourth adhesive layer includes a silicon nitride film.

[21]
The imaging device according to any one of [17] to [19], in which
the first adhesive layer includes a silicon nitride film, the first antireflection layer includes a silicon oxide film, and the second adhesive layer includes a silicon nitride film, and
the third adhesive layer includes a silicon oxide film, the second antireflection layer includes a silicon nitride film, and the fourth adhesive layer includes a silicon oxide film.

[22]
The imaging device according to any one of [1] to [21], further including a light emitting element that outputs excitation light with which a subject is irradiated.

[23]
The imaging device according to any one of [1] to [22], in which the second wiring layer has a wiring, and the wiring is a transparent wiring.

[24]
The imaging device according to any one of [1] to [23], in which the second wiring layer has a wiring, and the wiring is arranged in at least one area corresponding to between the pixels adjacent to each other in the plurality of pixels arranged two-dimensionally in the second pixel array unit.

[25]
The imaging device according to any one of [1] to [24], in which the second wiring layer has a wiring, and the wiring is arranged only in an area corresponding to the pixels of at least a part of the plurality of pixels arranged two-dimensionally in the second pixel array unit.

[26]
An electronic device equipped with the imaging device according to any one of [1] to [25].

REFERENCE SIGNS LIST 1 (1-1, 1-2, 1-6, 1-8) Imaging device
31 (31A, 31B), 32 (32A, 32B) Adhesive layer
41, 42 Antireflection layer 101 First substrate
101A First support layer
101B First wiring layer
101C First pixel array unit
102 Second substrate
102A Second support layer
102B Second wiring layer
102C Second pixel array unit

What is claimed is:

1. An imaging device comprising:
a first substrate including a first pixel array unit in which a plurality of pixels having at least a first photoelectric conversion unit that performs photoelectric conversion is arranged in a two-dimensional manner, a first wiring layer, and a first support layer stacked in this order; and
a second substrate including a second pixel array unit in which a plurality of pixels having at least a second photoelectric conversion unit that performs photoelectric conversion is arranged in a two-dimensional manner, a second wiring layer, and a second support layer stacked in this order,
wherein the first support layer and the second support layer are bonded to each other to form a stacked structure of the first substrate and the second substrate, and
at least one of the first support layer or the second support layer includes an antireflection layer.

2. The imaging device according to claim 1, wherein the antireflection layer includes a light-shielding film that shields excitation light with which a subject is irradiated and/or a transmission film that transmits fluorescence emitted from the subject by the excitation light.

3. The imaging device according to claim 2, wherein the excitation light has a wavelength of 760 nanometers±10 nanometers, and the fluorescence has a wavelength of 850 nanometers±10 nanometers.

4. The imaging device according to claim 1, wherein the first support layer includes a first antireflection layer, and the second support layer includes a second antireflection layer.

5. The imaging device according to claim 4, wherein
the first antireflection layer includes a light-shielding film that shields excitation light with which a subject is irradiated and/or a transmission film that transmits fluorescence emitted from the subject by the excitation light, and
the second antireflection layer includes a light-shielding film that shields excitation light with which a subject is irradiated and/or a transmission film that transmits fluorescence emitted from the subject by the excitation light.

6. The imaging device according to claim 5, wherein the excitation light has a wavelength of 760 nanometers±10 nanometers, and the fluorescence has a wavelength of 850 nanometers±10 nanometers.

7. The imaging device according to claim 1, wherein
the first support layer includes a first adhesive layer, a first antireflection layer, and a second adhesive layer stacked in this order,
the second support layer includes a third adhesive layer, a second antireflection layer, and a fourth adhesive layer stacked in this order, and
the second adhesive layer and the third adhesive layer are bonded to each other to form a stacked structure of the first substrate and the second substrate.

8. The imaging device according to claim 7, wherein
the first antireflection layer includes a light-shielding film that shields excitation light with which a subject is irradiated and/or a transmission film that transmits fluorescence emitted from the subject by the excitation light, and
the second antireflection layer includes a light-shielding film that shields excitation light with which a subject is irradiated and/or a transmission film that transmits fluorescence emitted from the subject by the excitation light.

9. The imaging device according to claim 8, wherein the excitation light has a wavelength of 760 nanometers±10 nanometers, and the fluorescence has a wavelength of 850 nanometers±10 nanometers.

10. The imaging device according to claim 7, wherein
the first adhesive layer includes a silicon oxide film, the first antireflection layer includes a silicon nitride film, and the second adhesive layer includes a silicon oxide film, and
the third adhesive layer includes a silicon nitride film, the second antireflection layer includes a silicon oxide film, and the fourth adhesive layer includes a silicon nitride film.

11. The imaging device according to claim 7, wherein
the first adhesive layer includes a silicon nitride film, the first antireflection layer includes a silicon oxide film, and the second adhesive layer includes a silicon nitride film, and
the third adhesive layer includes a silicon oxide film, the second antireflection layer includes a silicon nitride film, and the fourth adhesive layer includes a silicon oxide film.

12. The imaging device according to claim 1, further comprising a light emitting element that outputs excitation light with which a subject is irradiated.

13. The imaging device according to claim 1, wherein the second wiring layer has a wiring, and the wiring is a transparent wiring.

14. The imaging device according to claim 1, wherein the second wiring layer has a wiring, and the wiring is arranged in at least one area corresponding to between the pixels adjacent to each other in the plurality of pixels arranged two-dimensionally in the second pixel array unit.

15. The imaging device according to claim 1, wherein the second wiring layer has a wiring, and the wiring is arranged only in an area corresponding to the pixels of at least a part of the plurality of pixels arranged two-dimensionally in the second pixel array unit.

16. An electronic device equipped with the imaging device according to claim 1.

* * * * *